(12) United States Patent
Jang et al.

(10) Patent No.: US 12,364,118 B2
(45) Date of Patent: Jul. 15, 2025

(54) DISPLAY PANEL HAVING FRONT, SIDE, AND CORNER DISPLAY AREAS AND DISPLAY APPARATUS INCLUDING THE SAME

(71) Applicant: SAMSUNG DISPLAY CO., LTD., Yongin-si (KR)

(72) Inventors: Jaeyong Jang, Yongin-si (KR); Sunhwa Lee, Yongin-si (KR); Yujin Lee, Yongin-si (KR); Heejean Park, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 660 days.

(21) Appl. No.: 17/696,045

(22) Filed: Mar. 16, 2022

(65) Prior Publication Data
US 2022/0302243 A1    Sep. 22, 2022

(30) Foreign Application Priority Data
Mar. 22, 2021   (KR) ................... 10-2021-0036756

(51) Int. Cl.
*H01L 29/08*    (2006.01)
*H10K 59/121*   (2023.01)
*H10K 59/131*   (2023.01)

(52) U.S. Cl.
CPC ....... *H10K 59/131* (2023.02); *H10K 59/1213* (2023.02); *H10K 59/1216* (2023.02)

(58) Field of Classification Search
CPC ............. H10K 59/1216; H10K 59/131; H10K 59/1213
USPC ............................................ 257/40
See application file for complete search history.

(56) References Cited

U.S. PATENT DOCUMENTS

| | | |
|---|---|---|
| 10,147,777 B2 | 12/2018 | Lim et al. |
| 10,354,578 B2 | 7/2019 | Ka et al. |
| 10,483,341 B2 | 11/2019 | Jung et al. |
| 11,094,895 B2 | 8/2021 | Dai |
| 11,528,812 B2 | 12/2022 | Ahn et al. |

(Continued)

FOREIGN PATENT DOCUMENTS

| | | |
|---|---|---|
| CN | 108766977 A | 11/2018 |
| CN | 112133733 A | 12/2020 |

(Continued)

*Primary Examiner* — Phuc T Dang
(74) *Attorney, Agent, or Firm* — CANTOR COLBURN LLP

(57) ABSTRACT

A display panel may include: a substrate including a front display area, a corner display area extending from a corner of the front display area, and a peripheral area outside the corner display area, where the corner display area includes a first corner display area and a second corner display area; a first corner driving circuit positioned in the second corner display area and electrically connected to each of a front pixel arranged in the front display area and a corner pixel arranged in the first corner display area; a second corner driving circuit positioned in the second corner display area, electrically connected to the corner pixel arranged in the first corner display area, and not electrically connected to the front pixel; and a load portion positioned in the peripheral area and electrically connected to the second corner driving circuit.

20 Claims, 17 Drawing Sheets

(56) References Cited

U.S. PATENT DOCUMENTS

| | | | |
|---|---|---|---|
| 11,659,742 B2 * | 5/2023 | Won | H10K 59/1213 |
| | | | 257/72 |
| 11,665,940 B2 | 5/2023 | Zhou et al. | |
| 11,825,711 B2 | 11/2023 | Lee et al. | |
| 2017/0337873 A1 | 11/2017 | Kim et al. | |
| 2018/0240850 A1 | 8/2018 | Chen et al. | |
| 2019/0304558 A1 | 10/2019 | Dun et al. | |
| 2021/0376038 A1 | 12/2021 | Won et al. | |
| 2022/0013609 A1 | 1/2022 | Won et al. | |
| 2022/0052141 A1 | 2/2022 | Lee et al. | |

FOREIGN PATENT DOCUMENTS

| | | |
|---|---|---|
| KR | 1020170119270 A | 10/2017 |
| KR | 1020180018960 A | 2/2018 |
| KR | 1020190037389 A | 4/2019 |
| KR | 1020200063379 A | 6/2020 |
| KR | 1020210149279 A | 12/2021 |
| KR | 1020220006161 A | 1/2022 |
| KR | 1020220022135 A | 2/2022 |
| KR | 1020220030467 A | 3/2022 |

* cited by examiner

DISPLAY PANEL HAVING FRONT, SIDE, AND CORNER DISPLAY AREAS AND DISPLAY APPARATUS INCLUDING THE SAME

This application claims priority to Korean Patent Application No. 10-2021-0036756, filed on Mar. 22, 2021, and all the benefits accruing therefrom under 35 U.S.C. § 119, the content of which in its entirety is herein incorporated by reference.

BACKGROUND

1. Field

One or more embodiments relate to a display apparatus, and more particularly, to a display panel, in which a display area is expanded to display an image on not only a front area but also on side areas and/or corner areas, and a display apparatus including the display panel.

2. Description of the Related Art

Display apparatuses may visually display data. Display apparatuses may be used as displays for small products such as mobile phones or may be used as displays for large products such as televisions.

Recently, as the use of display apparatuses has diversified, various attempts have been made to improve the quality and functions of display apparatuses. For example, research and development on curved display apparatuses, foldable display apparatuses, and rollable display apparatuses are being actively conducted. Also, display areas are expanding, and non-display areas are being reduced in size. Accordingly, various methods have been derived to design the form of display apparatuses.

SUMMARY

One or more embodiments provide a display panel, in which a display area is expanded to display an image even on side areas and/or corner areas, and a display apparatus including the display panel.

According to an embodiment, a display panel includes a substrate including a front display area, a corner display area extending from a corner of the front display area a, and a peripheral area outside the corner display area, where the corner display area includes a first corner display area and a second corner display area, the first corner display area includes extension portions extending in a direction away from the front display area, and cutout portions are defined in the first corner display area between the extension portions, a first corner driving circuit positioned in the second corner display area and electrically connected to each of a front pixel arranged in the front display area and a corner pixel arranged in the first corner display area, a second corner driving circuit positioned in the second corner display area, electrically connected to the corner pixel arranged in the first corner display area, and not electrically connected to the front pixel, and a load portion positioned in the peripheral area and electrically connected to the second corner driving circuit.

According to an embodiment, the extension portions may include a first extension portion in which the load portion is not positioned and a second extension portion in which the load portion is positioned, the corner pixel electrically connected to the first corner driving circuit may be arranged in the first extension portion along an extending direction of the first extension portion, and the corner pixel electrically connected to the second corner driving circuit may be arranged in the second extension portion along an extending direction of the second extension portion.

According to an embodiment, the display panel may further include a voltage line positioned in the second corner display area, a corner voltage line extending in the extending direction of the second extension portion in the second extension portion, and including an end electrically connected to the voltage line and another end electrically connected to the load portion, and a corner signal line extending in the extending direction of the second extension portion in the second extension portion, and including an end electrically connected to the second corner driving circuit and another end electrically connected to the load portion.

According to an embodiment, the load portion may include a first conductive layer and a second conductive layer, where the second conductive layer may be disposed on the first conductive layer and overlapping the first conductive layer, the another end of the corner signal line may be electrically connected to the first conductive layer, and the another end of the corner voltage line may be electrically connected to the second conductive layer.

According to an embodiment, the corner pixel may be electrically connected to a corner pixel circuit including at least one thin-film transistor and at least one storage capacitor, the at least one thin-film transistor may include a semiconductor layer, a gate electrode overlapping the semiconductor layer, and a source electrode and a drain electrode which are electrically connected to the semiconductor layer, the at least one storage capacitor may include a lower electrode and an upper electrode, where the lower electrode may be disposed in a same layer as the gate electrode, and the upper electrode may overlap the lower electrode, the first conductive layer and at least one selected from the gate electrode and the lower electrode may have a same layer structure as each other and include a same material as each other, and the second conductive layer and the upper electrode may have a same layer structure and include a same material as each other.

According to an embodiment, the load portion may include a first conductive layer, a second conductive layer disposed on the first conductive layer and overlapping the first conductive layer, and a third conductive layer disposed on the second conductive layer and overlapping the second conductive layer, the another end of the corner signal line may be electrically connected to the first conductive layer, and the another end of the corner voltage line may be electrically connected to the third conductive layer.

According to an embodiment, the corner pixel may be electrically connected to a corner pixel circuit including at least one thin-film transistor and at least one storage capacitor, the at least one thin-film transistor may include a semiconductor layer, a gate electrode overlapping the semiconductor layer, and a source electrode and a drain electrode which are electrically connected to the semiconductor layer, the at least one storage capacitor may include a lower electrode and an upper electrode, where the lower electrode may be disposed in a same layer as the gate electrode, and the upper electrode overlapping the lower electrode, the first conductive layer and the semiconductor layer may have a same layer structure as each other and include a same material as each other, the second conductive layer and at least one selected from the gate electrode and the lower electrode may have a same layer structure as each other and include a same material as each other, and the third conductive layer and the upper electrode may have a same layer structure as each other and include a same material as each other.

According to an embodiment, when viewed in a direction perpendicular to an upper surface of the substrate, a shape of an outer edge of the load portion may correspond to a shape of an outer edge of an extension portion in which the load portion is positioned, among the extension portions.

According to an embodiment, one load portion may be arranged in each second extension portion.

According to an embodiment, two load portions may be arranged in each second extension portion.

According to an embodiment, the corner pixel arranged in the second corner display area may overlap the first corner driving circuit or the second corner driving circuit.

According to an embodiment, the display area may further include a side display area extending from a side surface of the front display area, and a side pixel may be arranged in the side display area.

According to an embodiment, a display apparatus includes a display panel including a front display area, a corner display area extending from a corner of the front display area and bent at a preset radius of curvature, and a peripheral area outside the corner display area, where the corner display area includes a first corner display area and a second corner display area, and a cover window covering the display panel and having a shape corresponding to a shape of the display panel, wherein the display panel includes a first corner driving circuit positioned in the second corner display area and electrically connected to each of a front pixel arranged in the front display area and a corner pixel arranged in the first corner display area, a second corner driving circuit positioned in the second corner display area, electrically connected to the corner pixel arranged in the first corner display area, and not electrically connected to the front pixel, and a load portion positioned in the peripheral area and electrically connected to the second corner driving circuit.

According to an embodiment, the first corner display area may include extension portions extending in a direction away from the front display area, the extension portions may include a first extension portion in which the load portion is not positioned and a second extension portion in which the load portion is positioned, the corner pixel electrically connected to the first corner driving circuit may be arranged in the first extension portion along an extending direction of the first extension portion, and the corner pixel electrically connected to the second corner driving circuit may be arranged in the second extension portion along an extending direction of the second extension portion.

According to an embodiment, the display apparatus may further include a voltage line positioned in the second corner display area, a corner voltage line extending along an extending direction of the second extension portion in the second extension portion, and including an end electrically connected to the voltage line and another end electrically connected to the load portion, and a corner signal line extending along an extending direction of the second extension portion in the second extension portion, and including an end electrically connected to the second corner driving circuit and another end electrically connected to the load portion.

According to an embodiment, the load portion may include a first conductive layer and a second conductive layer, the second conductive layer may be disposed on the first conductive layer and overlapping the first conductive layer, the another end of the corner signal line may be electrically connected to the first conductive layer, and the another end of the corner voltage line may be electrically connected to the second conductive layer.

According to an embodiment, the corner pixel may be electrically connected to a corner pixel circuit including at least one thin-film transistor and at least one storage capacitor, the at least one thin-film transistor may include a semiconductor layer, a gate electrode overlapping the semiconductor layer, and a source electrode and a drain electrode which are electrically connected to the semiconductor layer, the at least one storage capacitor may include a lower electrode and an upper electrode, where the lower electrode may be disposed in a same layer as the gate electrode, and the upper electrode may overlap the lower electrode, the first conductive layer and at least one selected from the gate electrode and the lower electrode may have a same layer structure and include a same material as each other, and the second conductive layer and the upper electrode may have a same layer structure and include a same material as each other.

According to an embodiment, the load portion may include a first conductive layer, a second conductive layer disposed on the first conductive layer and overlapping the first conductive layer, and a third conductive layer disposed on the second conductive layer and overlapping the second conductive layer, the another end of the corner signal line may be electrically connected to the first conductive layer, and the another end of the corner voltage line may be electrically connected to the third conductive layer.

According to an embodiment, the corner pixel may be electrically connected to a corner pixel circuit including at least one thin-film transistor and at least one storage capacitor, the at least one thin-film transistor may include a semiconductor layer, a gate electrode overlapping the semiconductor layer, and a source electrode and a drain electrode which are electrically connected to the semiconductor layer, the at least one storage capacitor may include a lower electrode and an upper electrode, where the lower electrode may be disposed in a same layer as the gate electrode, and the upper electrode may overlap the lower electrode, the first conductive layer and the semiconductor layer may have a same layer structure as each other and include a same material as each other, the second conductive layer and at least one selected from the gate electrode and the lower electrode may have a same layer structure as each other and include a same material as each other, and the third conductive layer and the upper electrode may have a same layer structure as each other and include a same material as each other.

According to an embodiment, on a plan view, a shape of an outer edge of the load portion may correspond to a shape of an outer edge of an extension portion in which the load portion is positioned, among the extension portions.

BRIEF DESCRIPTION OF THE DRAWINGS

The above and other features of certain embodiments of the disclosure will be more apparent from the following description taken in conjunction with the accompanying drawings, in which.

DETAILED DESCRIPTION

Figure 1:
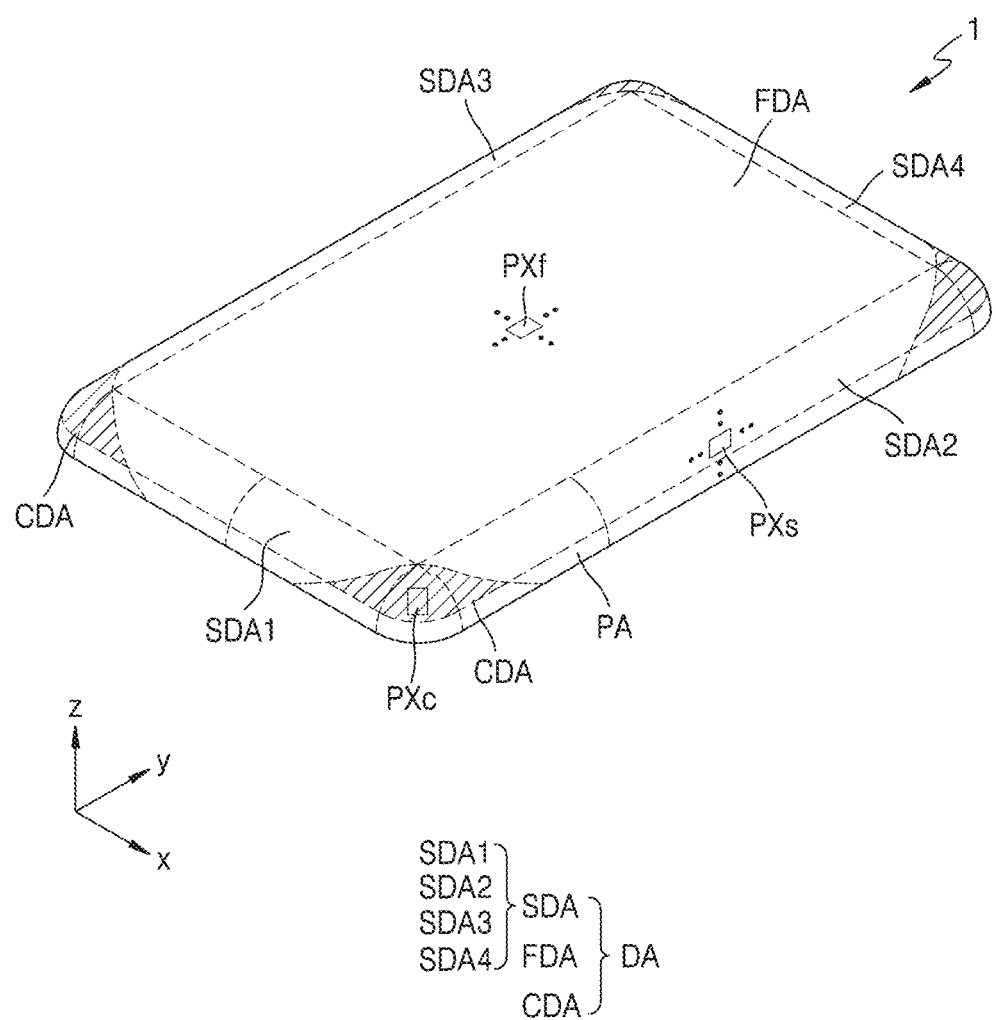
FIG. 1 is a schematic perspective view of a part of a display apparatus, according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

As the disclosure allows for various changes and numerous embodiments, certain embodiments will be illustrated in the drawings and described in the detailed description. Effects and features of the disclosure, and methods for achieving them will be clarified with reference to embodiments described below in detail with reference to the drawings. However, the disclosure is not limited to the following embodiments and may be embodied in various forms.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. Also, an expression such as "at least one of A and B" indicates A, B, or A and B. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly on the other element or intervening elements may be therebetween. In contrast, when an element is referred to as being "directly on" another element, there are no intervening elements present.

Sizes of elements in the drawings may be exaggerated or contracted for convenience of explanation. In addition, because sizes and thicknesses of elements in the drawings are arbitrarily illustrated for convenience of explanation, the disclosure is not limited thereto.

When a certain embodiment may be implemented differently, a particular process order may be performed differently from the described order. For example, two consecutively described processes may be performed substantially at the same time or may be performed in an order opposite to the described order.

It will be understood that when a layer, region, or element is referred to as being "connected to" another layer, region, or element, it may be "directly connected to" the other layer, region, or element or may be "indirectly connected to" the other layer, region, or element with one or more intervening layers, regions, or elements therebetween. For example, it will be understood that when a layer, region, or element is referred to as being "electrically connected to" another layer, region, or element, it may be "directly electrically connected to" the other layer, region, or element and/or may be "indirectly electrically connected to" the other layer, region, or element with one or more intervening layers, regions, or elements therebetween.

The x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

The embodiments will now be described more fully with reference to the accompanying drawings. When describing embodiments with reference to the accompanying drawings, the same or corresponding elements are denoted by the same reference numerals and a redundant description thereof will be omitted.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be described in detail with reference to the accompanying drawings.

Figure 2A:
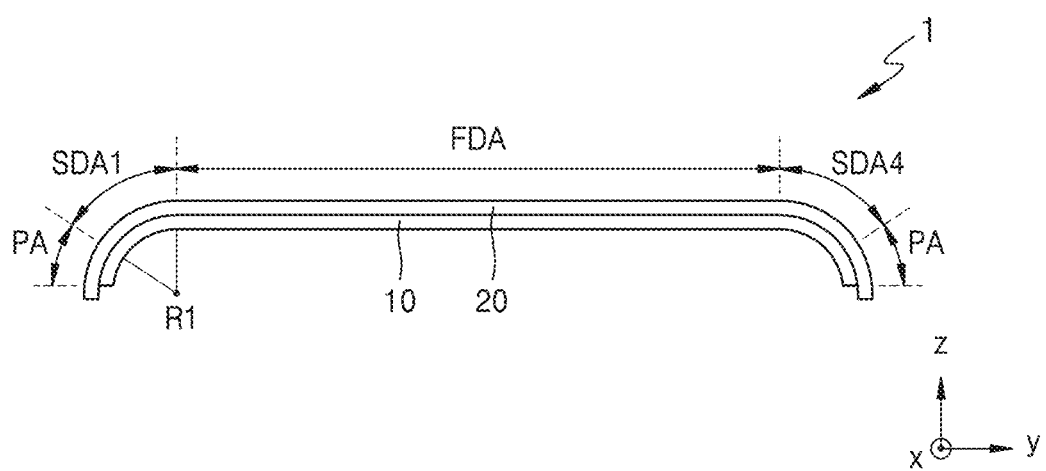
FIGS. 2A to 2C are schematic cross-sectional views of a part of the display apparatus of FIG. 1.
Figure 2B:
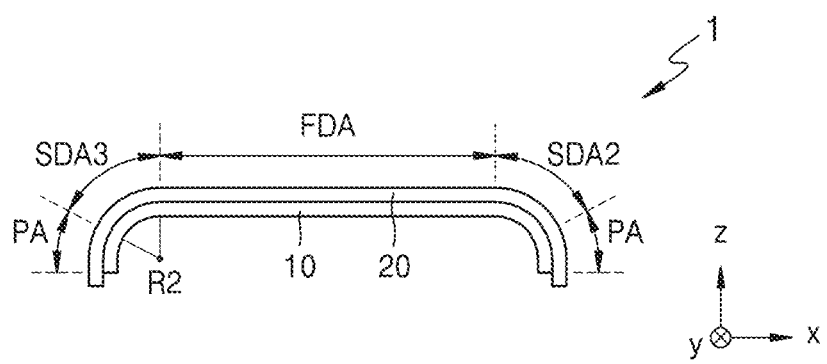
Figure 2C:
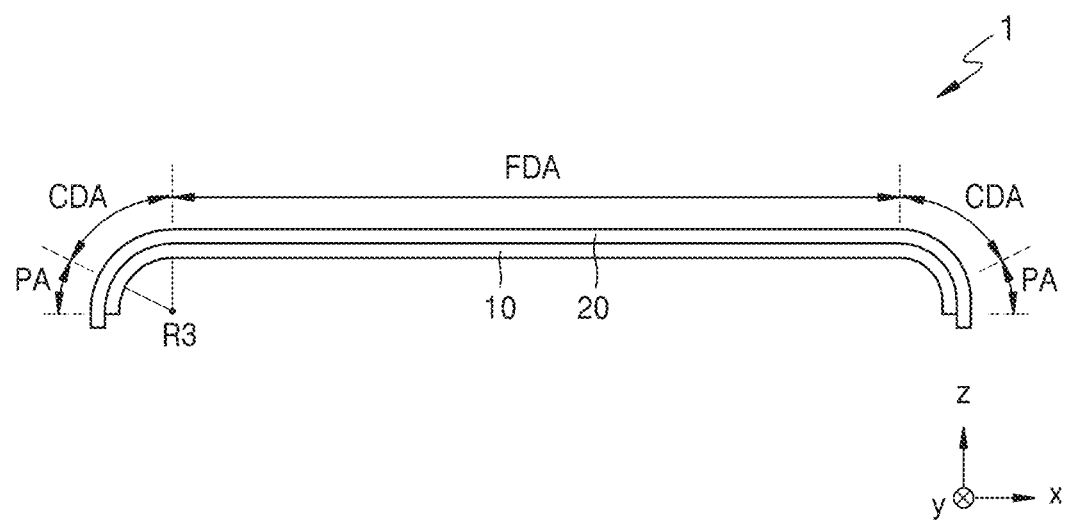

FIG. 1 is a schematic perspective view of a part of a display apparatus 1, according to an embodiment, and FIGS. 2A to 2C are schematic cross-sectional views of a part of the display apparatus 1 of FIG. 1.

In detail, FIGS. 2A and 2B respectively correspond to cross-sectional views of the display apparatus 1 taken along an x-direction and a y-direction of FIG. 1, and FIG. 2C illustrates a cross-section in which corner display areas CDA are respectively arranged on opposing sides of a front display area FDA in the display apparatus 1.

An embodiment of the display apparatus 1, which displays a moving image or a still image, may be various apparatuses with a display screen, such as not only portable electronic apparatuses, such as mobile phones, smartphones, tablet personal computers ("PC"s), smartwatches, watch phones, mobile communication terminals, electronic notebooks, electronic books, portable multimedia players ("PMP"s), navigation systems, and ultra-mobile PCs ("UMPC"s), but also televisions, laptop computers, monitors, advertisement boards, and Internet of things ("IOT") apparatuses.

In an embodiment, as illustrated in FIG. 1, the display apparatus 1 may include a display area DA and a peripheral area PA outside the display area DA.

The display area DA may include a front display area FDA, a side display area SDA, and a corner display area CDA. A plurality of pixels PX including light-emitting elements may be arranged in each of the front display area FDA, the side display area SDA, and the corner display area CDA, and an image may be displayed through the pixels PX. Thus, in such an embodiment, the display apparatus 1 may display an image on front, side, and/or corner portions.

The front display area FDA is an area of the display area DA positioned on a front portion of a display panel 10. Front pixels PXf may be arranged in the front display area FDA. The front display area FDA may have a non-bendable and flat shape. FIG. 1 illustrates an embodiment where the front display area FDA has a rectangular shape including a short side in a first direction (e.g., the x-direction) and a long side in a second direction (e.g., the y-direction), but one or more embodiments are not limited thereto. In one embodiment, for example, the front display area FDA may be formed in an arbitrary shape, such as a rectangular shape, a polygonal shape other than the rectangular shape, a circular shape, an oval shape, or the like, in which corners where a short side and a long side meet are rounded.

The side display area SDA is an area of the display area DA positioned on a side portion of the display panel 10. Side pixels PXs may be arranged in the side display areas SDA. The side display area SDA may be an area extending from one side of the front display area FDA. In an embodiment, the side display area SDA may include a first side display area SDA1, a second side display area SDA2, a third side display area SDA3, and/or a fourth side display area SDA4 extending from respective sides (first to fourth sides) of the front display area FDA.

The side display area SDA may have a certain radius of curvature and may have a bent shape. In an embodiment, as shown in FIGS. 2A and 2B, both the first side display area SDA1 and the fourth side display area SDA4 have a first radius of curvature R1, and both the second side display area SDA2 and the third side display area SDA3 have a second radius of curvature R2, but one or more embodiments are not limited thereto. In an alternative embodiment, the first to fourth side display areas SDA1, SDA2, SDA3, and SDA4 may have a same radius of curvature as each other. In another alternative embodiment, at least two of the first to fourth side display areas SDA1, SDA2, SDA3, and SDA4 may have different radii of curvature from each other.

The corner display area CDA is an area of the display area DA positioned on a corner portion of the display panel 10. Corner pixels PXc may be arranged in the corner display areas CDA. The corner display area CDA may be between the side display areas SDA adjacent to each other. In one embodiment, for example, as illustrated in FIG. 1, the corner display area CDA may be between the first side display area SDA1 and the second side display area SDA2, between the second side display area SDA2 and the fourth side display area SDA4, between the third side display area SDA3 and the fourth side display area SDA4, and/or between the third side display area SDA3 and the first side display area SDA1.

Referring to FIG. 2C, the corner display area CDA may have a third radius of curvature R3 and may have a bent shape. In an embodiment, the third radius of curvature R3 may vary according to position. In such an embodiment, a change in the third radius of curvature R3 may depend on radii of curvature of the side display areas SDA adjacent to each other. In one embodiment, for example, the third radius of curvature R3 of the corner display area CDA between the first side display area SDA1 and the second side display area SDA2 may depend on the first radius of curvature R1 of the first side display area SDA1 and the second radius of curvature R2 of the second side display area SDA2. In one embodiment, for example, where the first radius of curvature R1 is less than the second radius of curvature R2, the third radius of curvature R3 of the corner display area CDA may gradually increase in a direction from the first side display area SDA1 to the second side display area SDA2. In such an embodiment, the third radius of curvature R3 of the corner display area CDA may vary in a range of the first radius of curvature R1 or more to the second radius of curvature R2 or less.

In an embodiment, the resolution of the corner display area CDA and/or the resolution of the side display area SDA may be relatively low compared to the resolution of the front display area FDA. In such an embodiment, the number of corner pixels PXc arranged per unit area in the corner display area CDA and/or the number of side pixels PXs arranged per unit area in the side display area SDA may be less than the number of front pixels PXf arranged per unit area in the front display area FDA. In an alternative embodiment, the resolution of the corner display area CDA and/or the resolution of the side display area SDA may be the same as or relatively higher than the resolution of the front display area FDA.

The peripheral area PA may be a non-display area that does not display an image. The peripheral area PA may surround at least part of the display area DA. In one embodiment, for example, the peripheral area PA may entirely surround the display area DA. In an embodiment, various wirings for transmitting electrical signals to be applied to the display area DA may be located in the peripheral area PA. In such an embodiment, part of a circuit portion for controlling electrical signals to be applied to the display area DA may be located in the peripheral area PA.

Referring to FIGS. 2A to 2C, an embodiment of the display apparatus 1 may include the display panel 10 and a cover window 20 arranged or disposed on the display panel 10.

The cover window 20 may cover and protect the display panel 10. The cover window 20 may include a transparent material. The cover window 20 may include, for example, glass or plastic. In an embodiment where the cover window 20 includes plastic, the cover window 20 may have a flexible property.

A shape of the cover window 20 may correspond to a shape of the display apparatus 1. In one embodiment, for example, where the display apparatus 1 includes the side display area SDA and the corner display area CDA, the cover window 20 may include a side area corresponding to the side display area SDA and a corner area corresponding to the corner display area CDA. The side area and the corner area of the cover window 20 may be bent with a certain curvature. In such an embodiment, the curvature of the side area and/or the curvature of the corner area of the cover window 20 may be a constant curvature or a variable curvature.

The display panel 10 may be arranged or disposed under the cover window 20. In an embodiment, the cover window 20 and the display panel 10 may be coupled to each other through an adhesive member (not illustrated). The adhesive member may be an optically clear adhesive film ("OCA") or an optically clear resin ("OCR").

Figure 3A:
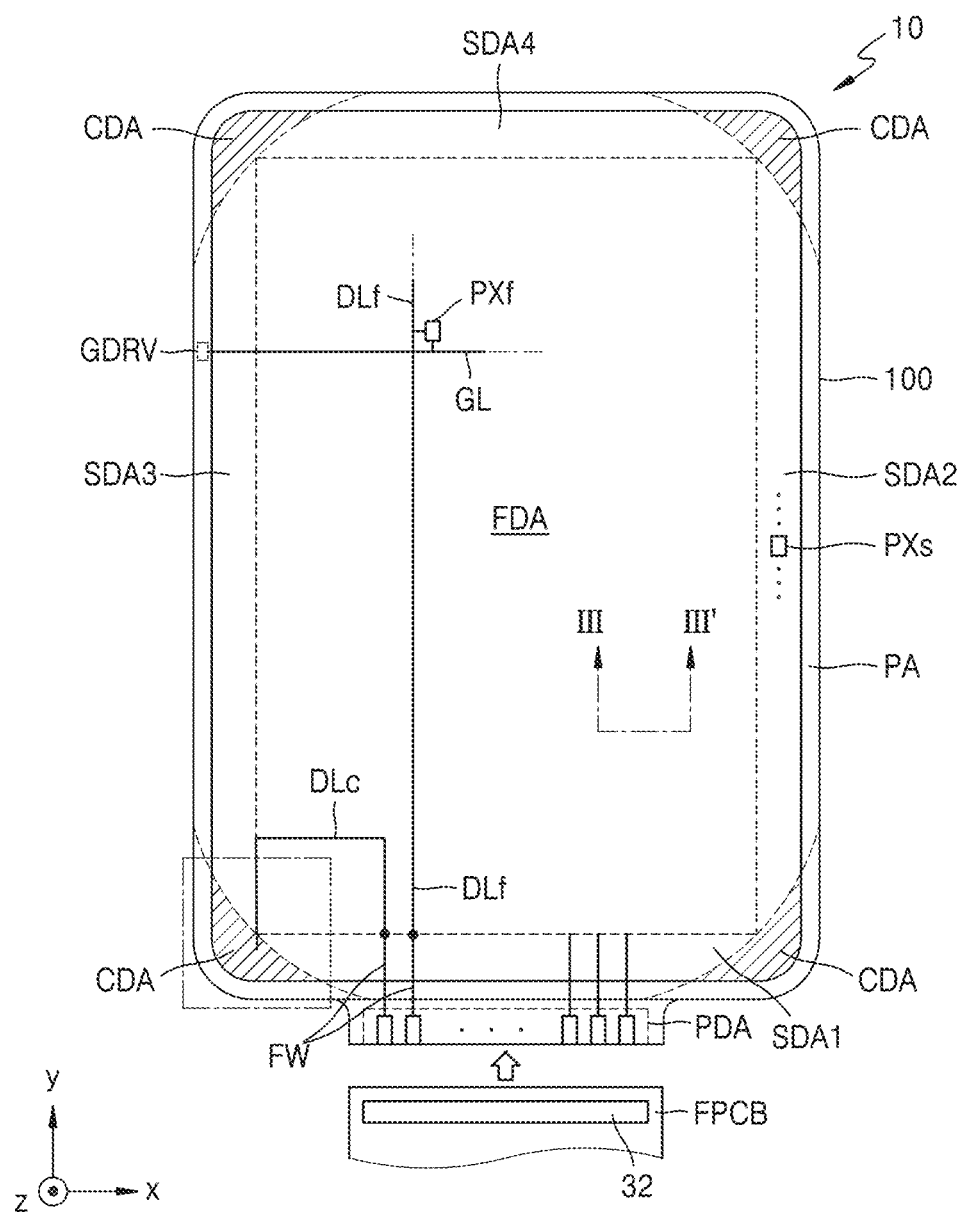
FIG. 3A is a schematic plan view of a part of a display panel that may be included in the display apparatus of FIG. 1.
Figure 3B:
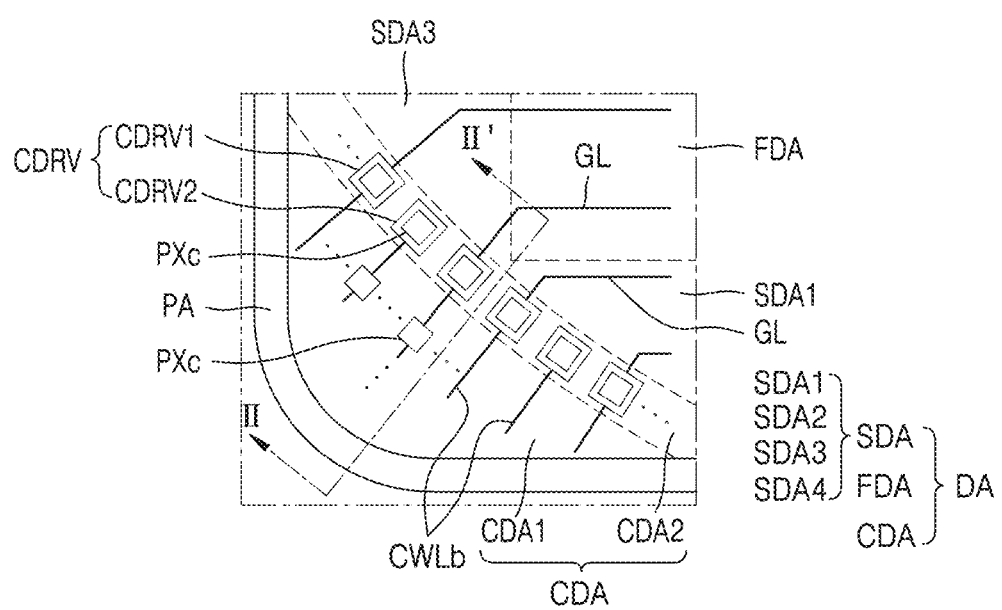
FIG. 3B is an enlarged view of the encircled portion of FIG. 3A.

FIG. 3A is a schematic plan view of a part of the display panel 10 that may be included in the display apparatus of FIG. 1, and FIG. 3B is an enlarged view of the encircled portion of FIG. 3A.

For reference, FIG. 3A illustrates an embodiment in a state before the side display area SDA and the corner display area CDA of the display panel 10 are bent, and as illustrated in FIG. 1, the side display area SDA and the corner display area CDA may be bent.

In an embodiment, as illustrated in FIG. 3A, the display panel 10 may include a substrate 100 and components on the substrate 100.

The substrate 100 may include the display area DA including the front display area FDA, the side display area SDA, and the corner display area CDA, and the peripheral area PA outside the display area DA. A plurality of pixels may be arranged or disposed on the display area DA, and each of the pixels may be configured as or defined by a set of a plurality of subpixels. In an embodiment, each of the pixels may include subpixels, each including a light-emitting element that emits red, green, blue, and/or white light.

A plurality of front pixels PXf are arranged on the front display area FDA. A front image may be displayed on the front display area FDA by the front pixels PXf. In one embodiment, for example, the front pixels PXf may be positioned at a point crossing a gate line GL extending in the first direction (e.g., the x-direction) and a data line DL extending in the second direction (e.g., the y-direction), but not being limited thereto. In such an embodiment, the gate line GL is configured to transmit an electrical control signal to a pixel circuit included in the pixels. The gate line GL may include a scan line configured to transmit a scan signal and/or an emission control line configured to transmit an emission control signal.

The side display area SDA may be arranged at upper, lower, left, and right sides of the front display area FDA. The side display area SDA may extend from each side of the front display area FDA. A plurality of side pixels PXs are arranged in the side display area SDA. A side image may be displayed on the side display area SDA by the side pixels PXs. The side image may form an entire image together with the front image, or the side image may be an image independent from the front image.

The corner display area CDA may be arranged in an area extending from corners of the front display area FDA. The corner display area CDA may be between two side display areas SDA. A plurality of corner pixels PXc are arranged in the corner display area CDA. A corner image may be displayed on the corner display area CDA by the corner pixels PXc. The corner image may form an entire image together with the front image and/or the side image, or the corner image may be an image independent from the front image and/or the side image.

In an embodiment, as shown in FIG. 3B, the corner display area CDA may include a first corner display area CDA1 and a second corner display area CDA2. The first corner display area CDA1 may be arranged closer to an edge of the substrate 100 than the second corner display area CDA2, and the second corner display area CDA2 may be between the first corner display area CDA1 and the front display area FDA.

In an embodiment, a corner driving circuit CDRV may be arranged in the second corner display area CDA2 in addition to the corner pixels PXc. In an embodiment, the corner pixels PXc arranged in the second corner display area CDA2 may overlap the corner driving circuit CDRV.

The corner driving circuit CDRV may provide a control signal (e.g., a scan signal and/or an emission control signal) for driving the corner pixels PXc arranged in the corner display area CDA. In an embodiment, at least part of the corner driving circuit CDRV may provide a control signal for driving the front pixels PXf arranged in the front display area FDA and/or the side pixels PXs arranged in the side display area SDA. The corner driving circuit CDRV includes a first corner driving circuit CDRV1 and a second corner driving circuit CDRV2.

The first corner driving circuit CDRV1 is a corner driving circuit CDRV that is simultaneously electrically connected to a pixel circuit configured to drive the corner pixels PXc and a pixel circuit configured to drive the front pixels PXf. The gate line GL connected to the first corner driving circuit CDRV1 may extend in a direction from both sides of the first corner driving circuit CDRV1 to the front display area FDA and to the first corner display area CDA1, respectively.

The second corner driving circuit CDRV2 is a corner driving circuit CDRV that is electrically connected to the pixel circuit configured to drive the corner pixels PXc, but is not electrically connected to the pixel circuit configured to drive the front pixels PXf. The gate line GL connected to the second corner driving circuit CDRV2 extends in a direction from the second corner driving circuit CDRV2 to the first corner display area CDA1, and does not extend in a direction toward the front display area FDA.

The peripheral area PA may be arranged outside the display area DA. In an embodiment, the peripheral area PA may be arranged outside the side display area SDA and outside the corner display area CDA. The peripheral area PA may include a gate driving circuit GDRV and a terminal portion PDA.

The gate driving circuit GDRV may be configured to provide a control signal (e.g., a scan signal and/or an emission control signal) for driving the front pixels PXf and the side pixels PXs. The gate driving circuit GDRV may be arranged at a right side of the second side display area SDA2 and/or at a left side of the third side display area SDA3. The gate driving circuit GDRV may be connected to the gate line GL extending in the x-direction.

The terminal portion PDA may be arranged at a lower side of the first side display area SDA1. The terminal portion PDA is not covered by an insulating layer and is exposed to be connected to a display circuit board FPCB. A display driver 32 may be arranged or disposed on the display circuit board FPCB.

The display driver 32 may generate a control signal to be transmitted to the corner driving circuit CDRV and the gate driving circuit GDRV. The display driver 32 may further generate a data signal. The generated data signal may be transmitted to the front pixels PXf, the side pixels PXs, and the corner pixels PXc through the fan-out wire FW and the data line DL electrically connected to the fan-out wire FW. A front data line DLf may extend in the y-direction to be electrically connected to the pixel circuits configured to drive the front pixels PXf. A corner data line DLc may be bent from the front display area FDA and may extend in a direction toward the corner display area CDA. The corner data line DLc may be electrically connected to the pixel circuits configured to drive the corner pixels PXc.

Figure 4:
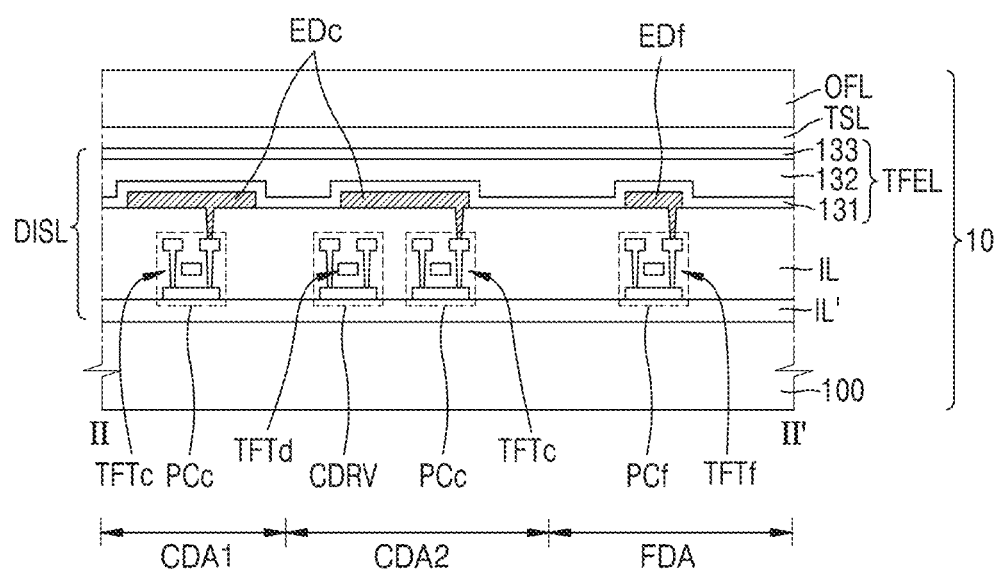
FIG. 4 is a schematic cross-sectional view of a part of a display panel, according to an embodiment.

FIG. 4 is a schematic cross-sectional view of a part of the display panel 10, according to an embodiment. FIG. 4 corresponds to a cross-sectional view of the display panel 10 taken along line II-II' of FIG. 3B.

In an embodiment, as illustrated in FIG. 4, the display panel 10 may include the corner display area CDA and the front display area FDA, and the corner display area CDA may include the first corner display area CDA1 and the second corner display area CDA2. The display panel 10 may include the substrate 100 and a display layer DISL, a touchscreen layer TSL, and an optical functional layer OFL, which are arranged over the substrate 100.

The display layer DISL may include a circuit layer including thin-film transistors TFTf, TFTc, and TFTd, a display element layer including light-emitting elements EDf and EDc, which are display elements, and an encapsulation layer TFEL. Insulating layers IL and IL' may be arranged in the display layer DISL and may be between the substrate 100 and the display layer DISL.

The substrate 100 may include at least one selected from various materials such as glass, metal, or an organic material. In an embodiment, the substrate 100 may include a flexible material. In one embodiment, for example, the substrate 100 may include ultra-thin flexible glass (e.g., a thickness of tens to hundreds of micrometers (μm)) or a polymer resin. In an embodiment where the substrate 100 includes a polymer resin, the substrate 100 may include polyimide. Alternatively, the substrate 100 may include polyethersulfone, polyarylate, polyetherimide, polyethylene naphthalate, polyethylene terephthalate ("PET"), polyphenylene sulfide, polycarbonate, cellulose triacetate, and/or cellulose acetate propionate.

A front pixel circuit PCf and a front display element EDf electrically connected thereto may be arranged in the front display area FDA of the display panel 10. The front pixel circuit PCf may include a front thin-film transistor TFTf and may be configured to control light emission of the front display element EDf.

Corner pixel circuits PCc and corner display elements EDc electrically connected thereto may be arranged in the first corner display area CDA1 and the second corner display area CDA2 of the display panel 10. Each corner pixel circuit PCc may include a corner thin-film transistor TFTc and may be configured to control light emission of the corner display element EDc.

In an embodiment, the corner driving circuit CDRV may be further arranged in the second corner display area CDA2. The corner driving circuit CDRV includes a driving circuit thin-film transistor TFTd and may be configured to provide a control signal (e.g., a scan signal and/or an emission control signal) to corner pixel circuits PCc arranged in the corner display area CDA. The corner display elements EDc arranged in the first corner display area CDA1 and the second corner display area CDA2 may be arranged in a same pixel arrangement as each other or in different pixel arrangements from each other. In an embodiment, the corner display element EDc arranged in the second corner display area CDA2 may be arranged to overlap the corner driving circuit CDRV.

The front display element EDf and the corner display elements EDc, which are display elements, may be easily damaged by moisture or oxygen from the outside, and thus may be covered and protected by the encapsulation layer TFEL. The encapsulation layer TFEL may include at least one organic encapsulation layer and at least one inorganic encapsulation layer. In one embodiment, for example, the encapsulation layer TFEL may include a first inorganic encapsulation layer 131, an organic encapsulation layer 132, and a second inorganic encapsulation layer 133.

The first inorganic encapsulation layer 131 and the second inorganic encapsulation layer 133 may include silicon oxide, silicon nitride, and/or silicon trioxynitride. Because the first inorganic encapsulation layer 131 is formed along a structure thereunder, an upper surface thereof is not flat, and thus the organic encapsulation layer 132 is formed to cover the first inorganic encapsulation layer 131 so that the upper surface thereof is flat. The organic encapsulation layer 132 may include at least one material selected from polyethylene terephthalate, polyethylene naphthalate, polycarbonate, polyimide, polyethylene sulfonate, polyoxymethylene, polyarylate, and hexamethyldisiloxane.

The touchscreen layer TSL may obtain coordinate information corresponding to an external input, for example, a touch event. The touchscreen layer TSL may include a touch electrode and touch wires connected to the touch electrode. The touchscreen layer TSL may sense an external input by using a self-capacitance method or a mutual capacitance method.

In an embodiment, the touchscreen layer TSL may be disposed or formed on the encapsulation layer TFEL. Alternatively, the touchscreen layer TSL may be separately formed over a touch substrate and then coupled onto the encapsulation layer TFEL through an adhesive layer such as an OCA. In an embodiment, the touchscreen layer TSL may be directly formed on the encapsulation layer TFEL, and in such an embodiment, the adhesive layer may not be between the touchscreen layer TSL and the encapsulation layer TFEL.

The optical functional layer OFL may include an anti-reflective layer. The anti-reflective layer may reduce the reflectance of light (external light) incident from the outside toward the display apparatus 1. In an embodiment, the optical functional layer OFL may be a polarization film. In an alternative embodiment, the optical functional layer OFL may be provided as a filter plate including a black matrix and color filters.

The display panel 10 may be a display panel including a light-emitting element. The light-emitting element included in the display panel 10 may be an organic light-emitting diode ("LED"), an inorganic LED, a micro LED, or a quantum dot LED. Hereinafter, for convenience of description, embodiments where each of the pixels included in the display panel 10 is a light-emitting element including an organic LED will be described in detail.

Figure 5:
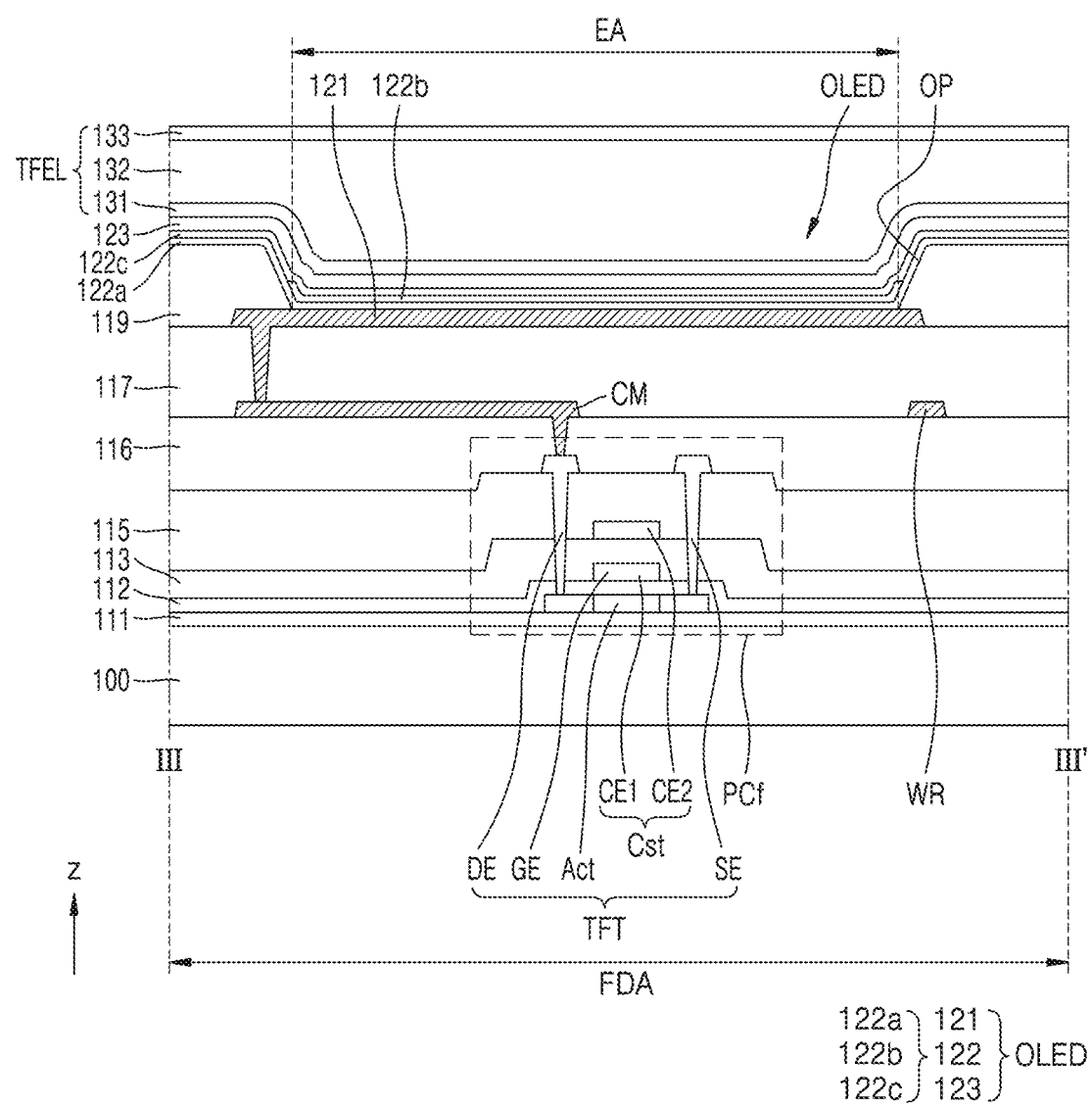
FIG. 5 is a schematic cross-sectional view of a part of a display panel, according to an embodiment.

FIG. 5 is a schematic cross-sectional view of a part of a display panel, according to an embodiment. FIG. 5 corresponds to a cross-sectional view of the display panel 10 (see FIG. 3) taken along line III-Ill' of FIG. 3A.

Referring to FIG. 5, a front pixel circuit PCf including a thin-film transistor TFT and a storage capacitor Cst, and an organic light-emitting diode OLED as a display element connected to the front pixel circuit PCf may be arranged in the front display area FDA. One front subpixel may be implemented in an emission area EA of the organic light-emitting diode OLED.

In an embodiment, the display panel 10 may include the substrate 100 and stacked elements arranged or disposed on the substrate 100. Hereinafter, a stacked structure of the display panel 10 will be described in detail.

The substrate 100 may include an insulating material such as glass, quartz, or a polymer resin. The substrate 100 may include a rigid substrate or a flexible substrate that is bendable, foldable, or rollable. In one embodiment, for example, the substrate 100 may have a structure in which an organic layer and an inorganic layer are stacked alternately one on another.

Referring to FIG. 5, a buffer layer 111 may be disposed on the substrate 100. The buffer layer 111 may reduce or prevent penetration of foreign materials, moisture, or external air from a lower portion of the substrate 100 and may increase smoothness of an upper surface of the substrate 100. The buffer layer 111 may include an inorganic material such as oxide or nitride, an organic material, or an organic/inorganic composite and may have a single-layered or multiple-layered structure of an inorganic material and an organic material. A barrier layer (not illustrated) that blocks penetration of external air may be further included between the substrate 100 and the buffer layer 111. In an embodiment, the buffer layer 111 may include silicon oxide and/or silicon nitride.

The thin-film transistor TFT may be arranged or disposed on the buffer layer 111. The thin-film transistor TFT may include a semiconductor layer Act, a gate electrode GE, a source electrode SE, and a drain electrode DE. The thin-film transistor TFT may be connected to the organic light-emitting diode OLED to drive the organic light-emitting diode OLED. In an embodiment, as illustrated in the drawings, a top-gate type thin-film transistor in which the gate electrode GE is arranged over the semiconductor layer Act with a first gate insulating layer 112 therebetween, but not being limited thereto. Alternatively, the thin-film transistor TFT may include a bottom-gate type thin-film transistor.

The semiconductor layer Act may be disposed on the buffer layer 111. The semiconductor layer Act may include a channel region, and a source region and a drain region doped with impurities at both opposing sides of the channel region. In such an embodiment, the impurities may include N-type impurities or P-type impurities. In an embodiment, the semiconductor layer Act may include polysilicon. In an alternative embodiment, the semiconductor layer Act may include amorphous silicon. In another alternative embodiment, the semiconductor layer Act may include an oxide of at least one selected from indium (In), gallium (Ga), stannum (Sn), zirconium (Zr), vanadium (V), hafnium (Hf), cadmium (Cd), germanium (Ge), chromium (Cr), titanium (Ti), and zinc (Zn). In an embodiment, the semiconductor layer Act may include a Zn oxide-based material, for example, Zn oxide, In—Zn oxide, Ga—In—Zn oxide, or the like. In an embodiment, the semiconductor layer Act may be In—Ga—Zn—O ("IGZO") semiconductor, In—Sn—Zn—O ("ITZO") semiconductor, or In—Ga—Sn—Zn—O ("IGTZO") semiconductor including metal such as In, Ga, and Sn in ZnO.

The first gate insulating layer 112 may cover the semiconductor layer Act. The first gate insulating layer 112 may include an inorganic insulating material such as silicon oxide, silicon nitride, silicon oxynitride, aluminum oxide, titanium oxide, tantalum oxide, or hafnium oxide. The first gate insulating layer 112 may have a single layer structure or a multilayer structure, each layer including at least one selected from the aforementioned inorganic insulating materials.

The gate electrode GE is arranged or disposed on the first gate insulating layer 112 to overlap the semiconductor layer Act. In an embodiment, the gate electrode GE may overlap the channel region of the semiconductor layer Act. The gate electrode GE may include at least one selected from various conductive materials including molybdenum (Mo), aluminum (Al), copper (Cu), Ti, and the like and may have various layer structures. In one embodiment, for example, the gate electrode GE may include a Mo layer and an Al layer or may have a multi-layered structure of a Mo layer/an Al layer/a Mo layer. Alternatively, the gate electrode GE may have a multi-layered structure including an ITO layer covering a metal material.

A second gate insulating layer 113 may be disposed or arranged on the first gate insulating layer 112 to cover the gate electrode GE. The second gate insulating layer 113 may include an inorganic insulating material such as silicon oxide, silicon nitride, silicon oxynitride, aluminum oxide, titanium oxide, tantalum oxide, or hafnium oxide. The second gate insulating layer 113 may have a single layer structure or a multilayer structure, each layer including at least one selected from the aforementioned inorganic insulating materials.

An upper electrode CE2 of the storage capacitor Cst may be arranged or disposed on the second gate insulating layer 113. The upper electrode CE2 of the storage capacitor Cst may overlap the gate electrode GE thereunder. The gate electrode GE and the upper electrode CE2, which overlap each other with the second gate insulating layer 113 therebetween, may form or collectively define the storage capacitor Cst. The gate electrode GE may be a lower electrode CE1 of the storage capacitor Cst.

The upper electrode CE2 may include Al, platinum (Pt), palladium (Pd), silver (Ag), magnesium (Mg), gold (Au), nickel (Ni), neodymium (Nd), iridium (Ir), Cr, calcium (Ca), Mo, Ti, tungsten (W), and/or Cu and may have a single layer structure or a multilayer structure, each layer including at least one selected from the aforementioned materials.

An interlayer insulating layer 115 may cover the upper electrode CE2 of the storage capacitor Cst. The interlayer insulating layer 115 may include an inorganic insulating material such as silicon oxide, silicon nitride, silicon oxynitride, aluminum oxide, titanium oxide, tantalum oxide, or hafnium oxide. The interlayer insulating layer 115 may have a single layer structure or a multilayer structure, each layer including at least one selected from the aforementioned inorganic insulating materials.

The source electrode SE and the drain electrode DE may be arranged or disposed on the interlayer insulating layer 115. Each of the source electrode SE and the drain electrode DE may include a conductive material including Mo, Al, Cu, Ti, and the like and may have a single layer structure or a multilayer structure, each layer including at least one selected from the aforementioned materials. In one embodiment, for example, the source electrode SE and the drain electrode DE may include a Ti layer and an Al layer or may have a multi-layered structure of a Ti layer/an Al layer/a Ti layer. Alternatively, the source electrode SE and the drain electrode DE may have a multi-layered structure including an ITO layer covering a metal material.

The thin-film transistor TFT may be covered by a first organic insulating layer 116. The first organic insulating layer 116 may cover the source electrode SE and the drain electrode DE. A connection electrode CM and various wires WR, for example, a driving voltage line or a data line, may be arranged or disposed on the first organic insulating layer 116 and thus may be desired in high integration. A second organic insulating layer 117 may be arranged or disposed on the first organic insulating layer 116 to cover the connection electrode CM and the wires WR.

The first and second organic insulating layers 116 and 117 may each include a flat upper surface so that an element arranged thereon may be flat. The first and second organic insulating layers 116 and 117 may include a general-purpose polymer such as photosensitive polyimide, polyimide, polystyrene ("PS"), polycarbonate ("PC"), benzocyclobutene ("BCB"), or polymethylmethacrylate ("PMMA"), a polymer derivative having a phenolic group, an acrylic polymer, an imide-based polymer, an arylether-based polymer, an amide-based polymer, a fluorine-based polymer, a p-xylene-based polymer, or a vinyl alcohol-based polymer. In an embodiment, the first organic insulating layer 116 may include a siloxane-based organic material having high light transmittance and flatness, for example, hexamethyldisiloxane, octamethyltrisiloxane, decamethyltetrasiloxane, dodecamethylpentasiloxane, and polydimethylsiloxane.

The organic light-emitting diode OLED may be arranged or disposed over the second organic insulating layer 117. A first electrode 121 of the organic light-emitting diode OLED may be connected to the front pixel circuit PCf through the connection electrode CM arranged or disposed on the first organic insulating layer 116.

The first electrode 121 may include a conductive oxide such as indium tin oxide ("ITO"), indium zinc oxide ("IZO"), zinc oxide (ZnO), indium oxide ($In_2O_3$), indium gallium oxide ("IGO"), or aluminum zinc oxide ("AZO"). The first electrode 121 may include a reflective layer including Ag, Mg, Al, Pt, Pd, Au, Ni, Nd, Ir, Cr, or any compound thereof. In one embodiment, for example, the first electrode 121 may have a structure including layers including ITO, IZO, ZnO, or $In_2O_3$ over and/or under the reflective layer. In an embodiment, the first electrode 121 may have a multi-layered structure of an ITO layer/an Ag layer/an ITO layer.

A pixel-defining layer 119 may be arranged or disposed on the second organic insulating layer 117 to cover an edge of the first electrode 121. A pixel opening OP may be defined through the pixel-defining layer 119 to expose a central portion of the first electrode 121. A size and shape of the emission area EA of the organic light-emitting diode OLED may be defined by the pixel opening OP of the pixel-defining layer 119.

The pixel-defining layer 119 may prevent an electric arc or the like from occurring on the edge of the first electrode 121 by increasing a distance between the edge of the first electrode 121 and a second electrode 123 on the first electrode 121. In one embodiment, for example, the pixel-defining layer 119 may include an organic insulating material such as polyimide, polyamide, an acrylic resin, BCB, hexamethyldisiloxane ("HMDSO"), and a phenolic resin and may be formed by a spin coating, etc.

An emission layer 122b formed to correspond to the first electrode 121 is disposed in the pixel opening OP of the pixel-defining layer 119. The emission layer 122b may include a polymer material or a low molecular weight material and may emit red, green, blue, or white light.

An intermediate layer 122 may be arranged or disposed on the pixel-defining layer 119, and the intermediate layer 122 may cover an upper surface of the first electrode 121 exposed by the pixel opening OP.

The intermediate layer 122 may include the emission layer 122b. The emission layer 122b may include, for example, an organic material. The emission layer 122b may include a polymer organic material or a low molecular weight organic material that emits light having a certain color. The intermediate layer 122 may include a first common layer 122a arranged or disposed under the emission layer 122b and/or a second common layer 122c arranged or disposed on the emission layer 122b.

The first common layer 122a may have a single layer structure or a multilayer structure. In one embodiment, for example, where the first common layer 122a includes a polymer material, the first common layer 122a, which is a hole transport layer ("HTL") that is a single-layered structure, may include poly-(3,4)-ethylene-dihydroxy thiophene ("PEDOT") or polyaniline ("PANI"). In an embodiment where the first common layer 122a includes a low molecular weight material, the first common layer 122a may include a hole injection layer ("HIL") and the HTL.

The second common layer 122c may be optional or selectively omitted. In one embodiment, for example, where the first common layer 122a and the emission layer 122b include a polymer material, the second common layer 122c may be provided or formed. The second common layer 122c may have a single layer structure or a multilayer structure. The second common layer 122c may include an electron transport layer ("ETL") and/or an electron injection layer ("EIL").

The emission layer 122b of the intermediate layer 122 may be arranged for each subpixel in the display area DA. The emission layer 122b may be disposed to overlap the pixel-defining layer 119, the pixel opening OP, and/or the first electrode 121. Each of the first and second common layers 122a and 122c of the intermediate layer 122 may be integrally formed as a single unitary body over the subpixels.

The second electrode 123 may include a conductive material having a low work function. In one embodiment, for example, the second electrode 123 may include a (semi-)transparent layer including Ag, Mg, Al, Pt, Pd, Au, Ni, Nd, Ir, Cr, lithium (Li), Ca, or any alloy thereof. Alternatively, the second electrode 123 may further include a layer such as ITO, IZO, ZnO, or $In_2O_3$ on the (semi-)transparent layer including the aforementioned material. The second electrode 123 may be integrally formed as a single unitary body to cover a plurality of first electrodes 121 in the display area DA. The intermediate layer 122 and the second electrode 123 may be formed by a thermal evaporation method.

Because the aforementioned organic light-emitting diode OLED may be easily damaged by external moisture, oxygen, or the like, the organic light-emitting diode OLED may be covered and protected by the encapsulation layer TFEL. The encapsulation layer TFEL may include at least one organic encapsulation layer and at least one inorganic encapsulation layer. In one embodiment, for example, as illustrated in FIG. 5, the encapsulation layer TFEL may include the first inorganic encapsulation layer 131, the organic encapsulation layer 132, and the second inorganic encapsulation layer 133.

The first inorganic encapsulation layer 131 may cover the second electrode 123. Other layers such as a capping layer (not illustrated) may be interposed between the first inorganic encapsulation layer 131 and the second electrode 123. Because the first inorganic encapsulation layer 131 is formed along a structure thereunder, an upper surface thereof is not flat, and thus the organic encapsulation layer 132 is formed to cover the first inorganic encapsulation layer 131 so that the upper surface thereof is flat. The second inorganic encapsulation layer 133 may cover the organic encapsulation layer 132.

The first and second inorganic encapsulation layers 131 and 133 may include silicon oxide, silicon nitride, and/or silicon trioxynitride. In an embodiment, the organic encapsulation layer 132 may include at least one material selected from polyethylene terephthalate, polyethylene naphthalate, polycarbonate, polyimide, polyethylene sulfonate, polyoxymethylene, polyarylate, and hexamethyldisiloxane. The organic encapsulation layer 132 may be formed by coating a monomer having flowability and then curing a monomer layer by using light such as heat or ultraviolet rays. Alternatively, the organic encapsulation layer 132 may be formed by coating the aforementioned polymer-based material. In an embodiment, each of the first inorganic encapsulation layer 131, the organic encapsulation layer 132, and the second inorganic encapsulation layer 133 may be integrally formed as a single unity body to cover the front display area FDA.

In an embodiment, the side display area SDA and the corner display area CDA may have a same stacked structure of the front display area FDA described above.

Figure 6A:
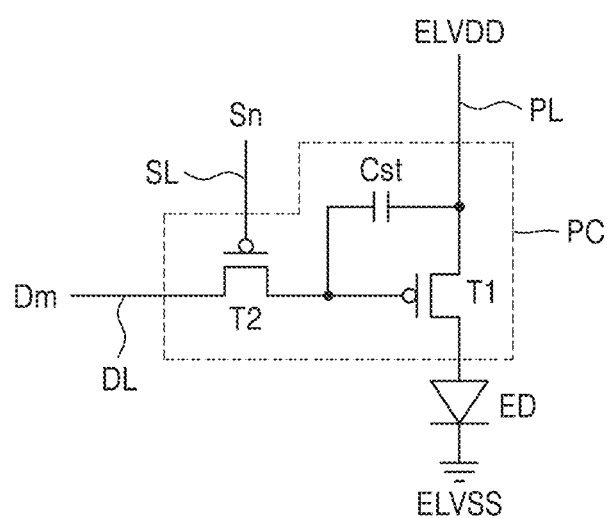
FIG. 6A is an equivalent circuit diagram of a subpixel according to an embodiment.
Figure 6B:
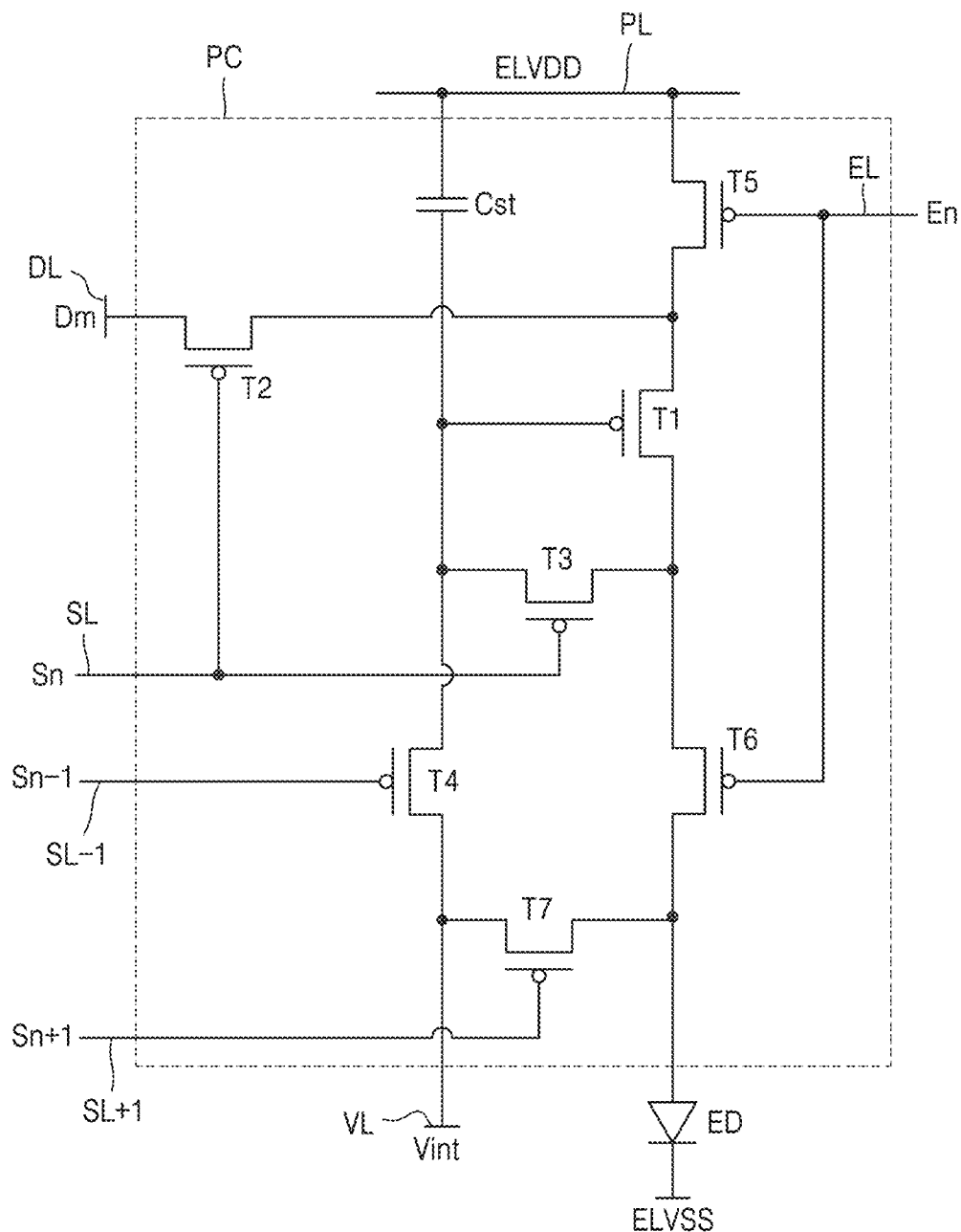
FIG. 6B is an equivalent circuit diagram of a subpixel according to an alternative embodiment.

FIG. 6A is an equivalent circuit diagram of a subpixel according to an embodiment, and FIG. 6B is an equivalent circuit diagram of the subpixel according to an alternative embodiment.

Referring to FIG. 6A, in an embodiment, a pixel circuit PC may be connected to a light-emitting element ED to implement light emission of subpixels. The pixel circuit PC may include a driving thin-film transistor T1, a switching thin-film transistor T2, and a storage capacitor Cst. The switching thin-film transistor T2 is connected to a scan line SL and a data line DL and may be configured to transmit a data signal Dm to the driving thin-film transistor T1 in response to a scan signal Sn input through the scan line SL, such that the data signal Dm is input through the data line DL.

The storage capacitor Cst is connected to the switching thin-film transistor T2 and a driving voltage line PL and is configured to store a voltage corresponding to a difference between a voltage received from the switching thin-film transistor T2 and a driving voltage ELVDD supplied to the driving voltage line PL.

The driving thin-film transistor T1 may be connected to the driving voltage line PL and the storage capacitor Cst and may control a driving current flowing from the driving voltage line PL to the light-emitting element ED in response to a voltage value stored in the storage capacitor Cst. The light-emitting element ED may emit light having a luminance corresponding to the driving current.

FIG. 6A illustrates an embodiment where the pixel circuit PC includes two thin-film transistors T1 and T2 and a single storage capacitor Cst, but one or more embodiments are not limited thereto. In such an embodiment, the number of thin-film transistors and the number of capacitors included in the pixel circuit PC may be variously changed according to a design of the pixel circuit PC. In one alternative embodiment, for example, the pixel circuit PC may further include three or more thin-film transistors in addition to the two thin-film transistors described above. In such an embodiment, one or more capacitors may be further included in addition to the storage capacitor Cst described above.

In an alternative embodiment, referring to FIG. 6B, the pixel circuit PC may include the driving thin-film transistor T1, the switching thin-film transistor T2, a compensation thin-film transistor T3, a first initialization thin-film transistor T4, an operation control thin-film transistor T5, an emission control thin-film transistor T6, and a second initialization thin-film transistor T7.

FIG. 6B illustrates an embodiment where each pixel circuit PC connected to signal lines SL, SL−1, SL+1, EL, and DL, an initialization voltage line VL, and a driving voltage line PL, but one or more embodiments are not limited thereto. In an alternative embodiment, at least one of the signal lines SL, SL−1, SL+1, EL, and DL, and/or the initialization voltage line VL may be shared by pixel circuits PC adjacent to each other.

A drain electrode of the driving thin-film transistor T1 may be electrically connected to the light-emitting element ED via the emission control thin-film transistor T6. The driving thin-film transistor T1 receives a data signal Dm in response to a switching operation of the switching thin-film transistor T2 and supplies a driving current to the light-emitting element ED.

A gate electrode of the switching thin-film transistor T2 is connected to the scan line SL, and a source electrode of the switching thin-film transistor T2 is connected to the data line DL. A drain electrode of the switching thin-film transistor T2 may be connected to a source electrode of the driving thin-film transistor T1 and the driving voltage line PL via the operation control thin-film transistor T5.

The switching thin-film transistor T2 is turned on in response to the scan signal Sn received through the scan line SL and performs a switching operation of transmitting the data signal Dm received through the data line DL to the source electrode of the driving thin-film transistor T1.

A gate electrode of the compensation thin-film transistor T3 may be connected to the scan line SL. A source electrode of the compensation thin-film transistor T3 may be connected to a first electrode (e.g., an anode) of the light-emitting element ED via the emission control thin-film transistor T6 while being connected to the drain electrode of the driving thin-film transistor T1. A drain electrode of the compensation thin-film transistor T3 may be simultaneously connected to one of electrodes of the storage capacitor Cst, a source electrode of the first initialization thin-film transistor T4, and a gate electrode of the driving thin-film transistor T1. The compensation thin-film transistor T3 is turned on in response to the scan signal Sn received through the scan line SL and connects the gate electrode and the drain electrode of the driving thin-film transistor T1 to each other, so that the driving thin-film transistor T1 is diode-connected.

A gate electrode of the first initialization thin-film transistor T4 may be connected to a previous scan line SL−1. A drain electrode of the first initialization thin-film transistor T4 may be connected to the initialization voltage line VL. A source electrode of the first initialization thin-film transistor T4 may be simultaneously connected to one of the electrodes of the storage capacitor Cst, the drain electrode of the compensation thin-film transistor T3, and the gate electrode of the driving thin-film transistor T1. The first initialization thin-film transistor T4 may be turned on in response to a previous scan signal Sn−1 transmitted through the previous scan line SL−1 and may perform an initialization operation of initializing a voltage of the gate electrode of the driving thin-film transistor T1 by transmitting an initialization voltage Vint to the gate electrode of the driving thin-film transistor T1.

A gate electrode of the operation control thin-film transistor T5 may be connected to an emission control line EL. A source electrode of the operation control thin-film transistor T5 may be connected to the driving voltage line PL. A drain electrode of the operation control thin-film transistor T5 is connected to the source electrode of the driving thin-film transistor T1 and the drain electrode of the switching thin-film transistor T2.

A gate electrode of the emission control thin-film transistor T6 may be connected to the emission control line EL. A source electrode of the emission control thin-film transistor T6 may be connected to the drain electrode of the driving thin-film transistor T1 and the source electrode of the compensation thin-film transistor T3. A drain electrode of the emission control thin-film transistor T6 may be electrically connected to the first electrode of the light-emitting element ED. The operation control thin-film transistor T5 and the emission control thin-film transistor T6 are simultaneously turned on in response to an emission control signal En received through the emission control line EL and are configured to transmit the driving voltage ELVDD to the light-emitting element ED, so that a driving current flows through the light-emitting element ED.

A gate electrode of the second initialization thin-film transistor T7 may be connected to a next scan line SL+1. A source electrode of the second initialization thin-film transistor T7 may be connected to the first electrode of the light-emitting element ED. A drain electrode of the second initialization thin-film transistor T7 may be connected to the initialization voltage line VL. The second initialization thin-film transistor T7 is turned on in response to a next scan signal Sn+1 received through the next scan line SL+1 and may initialize the first electrode of the light-emitting element ED.

FIG. 6B illustrates an embodiment where the first initialization thin-film transistor T4 and the second initialization thin-film transistor T7 are connected to the previous scan line SL−1 and the next scan line SL+1, respectively, but one or more embodiments are not limited thereto. In an alternative embodiment, the first initialization thin-film transistor T4 and the second initialization thin-film transistor T7 may all be connected to the previous scan line SL−1 and may be driven based on the previous scan signal Sn−1.

The other of the electrodes of the storage capacitor Cst may be connected to the driving voltage line PL. One of the electrodes of the storage capacitor Cst may be simultaneously connected to the gate electrode of the driving thin-film transistor T1, the drain electrode of the compensation thin-film transistor T3, and the source electrode of the first initialization thin-film transistor T4.

A second electrode (e.g., a cathode) of the light-emitting element ED receives a common voltage ELVSS. The light-emitting element ED receives a driving current from the driving thin-film transistor T1 and emits light.

The pixel circuit PC is not limited to the number of thin-film transistors, the number of storage capacitors, and the circuit designs described above with reference to FIGS. 6A and 6B. The number of thin-film transistors, the number of storage capacitors, and the circuit designs may vary.

The pixel circuits PC configured to drive subpixels arranged in each of the front display area FDA, the side display area SDA, and the corner display area CDA may be provided identically or differently from each other. In an embodiment, the pixel circuit PC configured to drive the subpixels arranged in each of the front display area FDA, the side display area SDA, and the corner display area CDA may be provided as the pixel circuit PC illustrated in FIG. 6B. In an alternative embodiment, the pixel circuit PC configured to drive the subpixels arranged in at least some of the front display area FDA, the side display area SDA, and the corner display area CDA may employ the pixel circuit PC illustrated in FIG. 6B, and the pixel circuit PC configured to drive the subpixels arranged in the remaining part may employ the pixel circuit PC illustrated in FIG. 6A.

Figure 7:
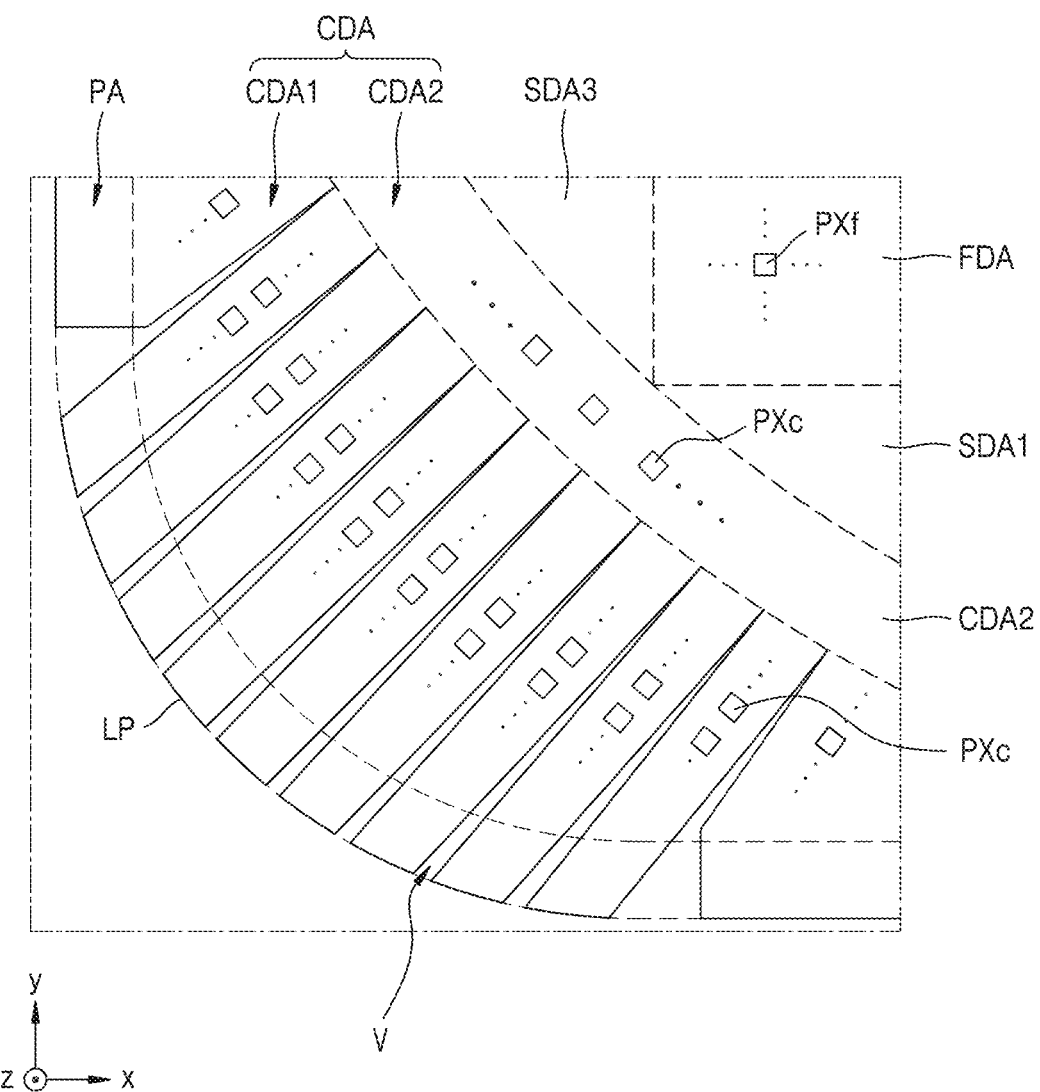
FIG. 7 is an enlarged schematic plan view of a part of a display panel, according to an embodiment.

FIG. 7 is an enlarged schematic plan view of a part of the display panel, according to an embodiment. In detail, FIG. 7 illustrates an enlarged view of the corner display area CDA of the display panel, in which the display panel is not bent and is unfolded.

As illustrated in FIG. 7, an embodiment of the display panel 10 may include a plurality of extension portions LP and a plurality of cutout portions V that are arranged to correspond to the corner display area CDA. The extension portions LP are areas extending in a direction away from the front display area FDA. The cutout portions V may be areas defined between the extension portions LP and may be through portions defined through the display panel 10.

Respective ends of the extension portions LP may be apart from each other with certain gaps. Empty spaces may be defined or formed between the extension portions LP due to the gaps, and may correspond to the cutout portions V, respectively. The gaps between the extension portions LP may vary. In an embodiment, as illustrated in FIG. 7, the gap between the extension portions LP in the front display area FDA may increase as moving in a direction away from the front display area FDA. In such an embodiment, the extension portions LP may be radially arranged. In an alternative embodiment, the gaps between the extension portions LP may not vary and be constant. In such an embodiment, the extension portions LP may be arranged in parallel to each other.

The extension portions LP may be connected at a portion adjacent to the front display area FDA. In an embodiment, as illustrated in FIG. 7, the extension portions LP may extend from the second corner display area CDA2 in a direction away from the front display area FDA. In an alternative embodiment, the extension portions LP may extend from the front display area FDA in a direction away from the front display area FDA. In an embodiment, the extension portions LP may extend to the peripheral area PA. In such an embodiment, at least part of the ends of the extension portions LP may overlap the peripheral area PA.

Extended lengths (or lengths in extending directions) of the extension portions LP may be different from each other. The extended lengths of the extension portions LP may be different from each other depending on a distance by which the extension portions LP are apart from a central portion of the corner display area CDA. In one embodiment, for example, among the extension portions LP, extension portions LP positioned at the central portion of the corner display area CDA may have a length in a direction away from the front display area FDA longer than that of the other extension portions LP. The extended lengths of extension portions LP may decrease as the extension portions LP are arranged farther from the central portion of the corner display area CDA.

Each of the cutout portions V may be defined through the display panel 10 from a front surface to a bottom surface of the display panel 10. Each of the cutout portions V may improve flexibility of the display panel 10. In such an embodiment, when external force (e.g., force such as bending, bending, or pulling) is applied to the display panel 10, shapes of the cutout portions V are changed, and thus, stress occurrence while the display panel 10 is transformed is reduced, and accordingly, durability of the display panel 10 may be improved.

When external force is applied to the display panel 10, areas or shapes of the cutout portions V may be changed, and positions of the extension portions LP may be changed. In one embodiment, for example, when force of bending edges of the display panel 10 and corner portions therebetween is applied, the gaps between the extension portions LP are reduced, and thus, the areas of the cutout portions V may be reduced, and the extension portions LP adjacent to each other may contact each other.

In an embodiment, as described above, when external force is applied to the display panel 10, the gaps between the extension portions LP, the areas of the cutout portions V, etc. may be changed, and the shapes of the extension portions LP may not be changed. In such an embodiment, a pixel circuit, a display element, and the like may be arranged in each of the extension portions LP, and even when external force is applied to the display panel 10, the shapes of the extension portions LP are not changed, and thus, the pixel circuit, the display element, and the like arranged in each of the extension portions LP may be protected.

In such an embodiment, where the shapes of the extension portions LP may not be changed when external force is applied to the display panel 10, the corner pixels PXc may be stably arranged in the corner display area CDA of the display panel 10. Accordingly, a display area in which an image is implemented may be expanded from the front display area FDA and the side display area SDA to the corner display area CDA. The corner pixels PXc arranged in the extension portions LP may be arranged to be apart from each other along an extension direction of the extension portions LP.

Figure 8:
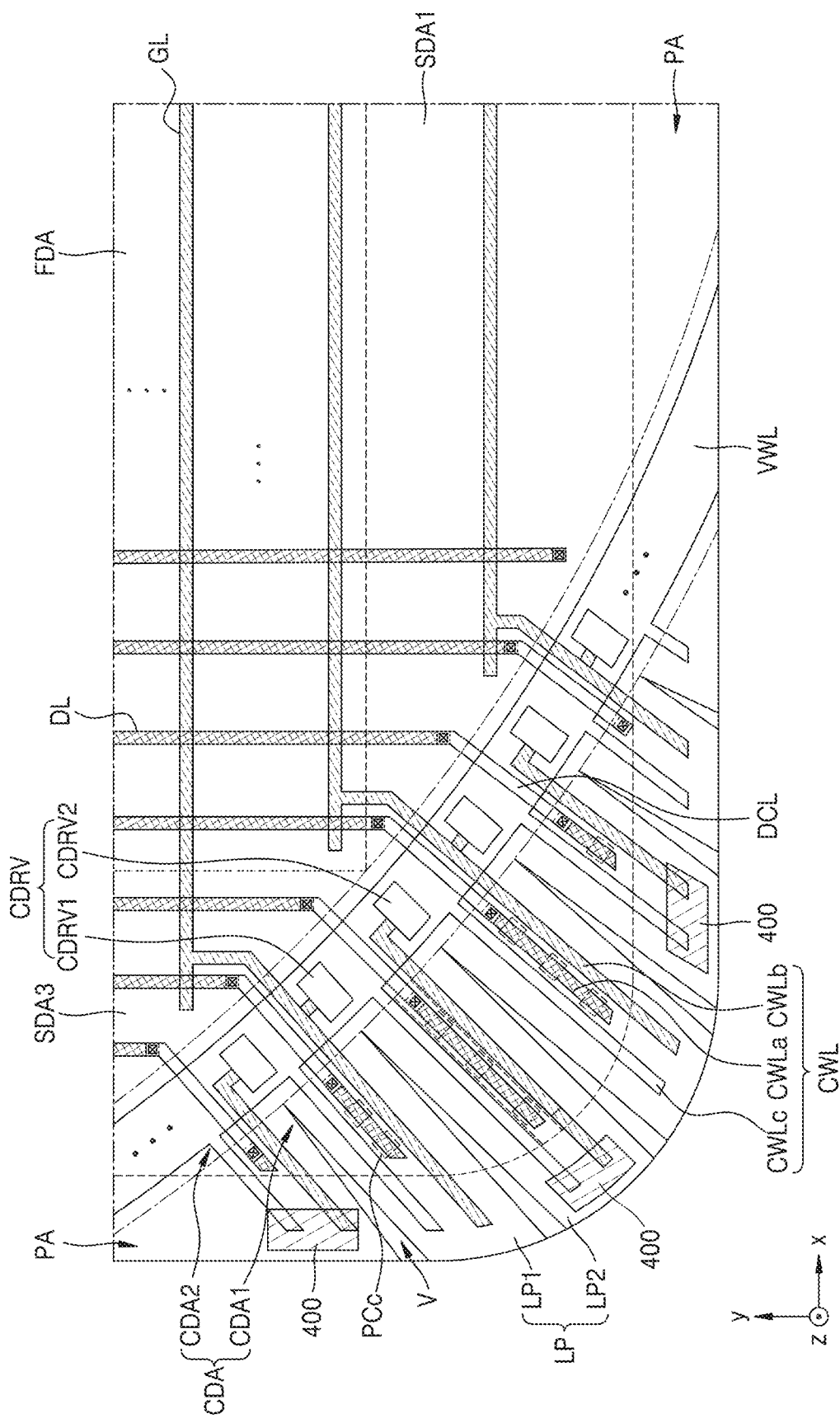
FIG. 8 is an enlarged schematic plan view of a part of a display panel, according to an embodiment.

FIG. 8 is an enlarged schematic plan view of a part of the display panel, according to an embodiment. In detail, FIG. 8 illustrates an enlarged view of the corner display area CDA of the display panel, in which the display panel is not bent and is unfolded.

As illustrated in FIG. 8, an embodiment of the display panel may include a display area and the peripheral area PA. The display area may include a front display area FDA, a first side display area SDA1 connected to the front display area FDA in a downward direction (e.g., a −y direction), a third side display area SDA3 connected to the front display area FDA in a left direction (e.g., a −x direction), and a corner display area CDA between the first side display area SDA1 and the third side display area SDA3 to surround at least part of the front display area FDA. In such an embodiment, the corner display area CDA may include the first corner display area CDA1 and the second corner display area CDA2 between the front display area FDA and the first corner display area CDA1.

Gate lines GL extending in the x-direction and data lines DL extending in the y-direction are arranged in the front display area FDA and the side display areas SDA1 and SDA3.

A voltage line VWL may be arranged in the second corner display area CDA2. In an embodiment, the voltage line VWL may extend in an extension direction of the second corner display area CDA2. The voltage line VWL may be the initialization voltage line VL (see FIG. 6B) and/or a common voltage line. The initialization voltage Vint (see FIG. 6B) and/or the common voltage ELVSS (see FIG. 6B) may be applied to the voltage line VWL. The voltage line VWL may be electrically connected to a corner voltage line CWLc arranged in the first corner display area CDA1.

A data connection line DCL may be arranged in the second corner display area CDA2. The data connection line DCL may be configured to electrically connect the data line DL arranged in the front display area FDA or the side display area SDA to the corner data line CWLa arranged in the first corner display area CDA1. In an embodiment, the data connection line DCL may be arranged or disposed in or directly on a different layer from the data line DL and the corner data line CWLa. In such an embodiment, the data connection line DCL may be electrically connected to the data connection line DCL, the data line DL, and the corner data line CWLa through a contact hole defined in an insulating layer provided between the data connection line DCL, the data line DL, and the corner data line CWLa. In an alternative embodiment, the data connection line DCL may be omitted, and the data line DL and the corner data line CWLa may be integrally formed as a single unitary body.

Corner driving circuits CDRV may be arranged in the second corner display area CDA2. The corner driving circuits CDRV may be arranged in a direction in which the second corner display area CDA2 extends.

The corner driving circuits CDRV arranged in the second corner display area CDA2 may include the first corner driving circuit CDRV1 and the second corner driving circuit CDRV2. The first corner driving circuit CDRV1 is a corner driving circuit CDRV that is electrically connected to both of the pixel circuit configured to drive the corner pixels PXc and the pixel circuit configured to drive the front pixels PXf. The gate line GL connected to the first corner driving circuit CDRV1 may extend in a direction from both opposing sides of the first corner driving circuit CDRV1 to the front display area FDA and to the first corner display area CDA1, respectively. The second corner driving circuit CDRV2 is a corner driving circuit CDRV that is electrically connected to the pixel circuit configured to drive the corner pixels PXc (see FIG. 7), but is not electrically connected to the pixel circuit configured to drive the front pixels PXf (see FIG. 7). The gate line GL connected to the second corner driving circuit CDRV2 extends in a direction from the second corner driving circuit CDRV2 to the first corner display area CDA1, and does not extend in a direction toward the front display area FDA.

In embodiments, the arrangement method of the first corner driving circuit CDRV1 and the second corner driving circuit CDRV2 are not particularly limited. In an embodiment, as shown in FIG. 8, the first corner driving circuit CDRV1 and the second corner driving circuit CDRV2 are alternately arranged with each other, but one or more embodiments are not limited thereto. In one alternative embodiment, for example, first corner driving circuits CDRV1 may be arranged to correspond to the gate line GL, and second corner driving circuits CDRV2 may be arranged considering a space between the first corner driving circuits CDRV1. In an embodiment, the number of second corner driving circuits CDRV2 between two adjacent first corner driving circuits CDRV1 may not be constant and may be variously changed or modified.

At least some of the voltage line VWL, the data connection line DCL, the corner driving circuit CDRV, and/or corner pixels arranged in the second corner display area CDA2 may be arranged to overlap each other.

The first corner display area CDA1 may include the extension portions LP extending in a direction away from the front display area FDA. In an embodiment, the extension portions LP may extend from the second corner display area CDA2 to the peripheral area PA, and the cutout portions V may be defined between the extension portions LP adjacent to each other.

In each of the extension portions LP, the corner pixels may be arranged to be apart from each other in a direction in which the extension portions LP extend. In an embodiment, the corner pixels may be arranged only in an area overlapping the corner display area CDA and may not be arranged in the peripheral area PA. In such an embodiment, the corner pixels are not arranged in an area overlapping the peripheral area PA of the extension portions LP, but are arranged only in an area overlapping the corner display area CDA of the extension portions LP.

Corner lines CWLa, CWLb, and CWLc may be arranged in each of the extension portions LP. Each of the corner lines CWLa, CWLb, and CWLc may be arranged in each of the extension portions LP and may extend in a direction in which each of the extension portions LP extends. The corner lines CWLa, CWLb, and CWLc may include the corner data line CWLa, a corner gate line CWLb, and the corner voltage line CWLc.

One end (or an end) of the corner data line CWLa may be electrically connected to the data line DL. In an embodiment, as described above, the corner data line CWLa may be electrically connected to the data line DL through the data connection line DCL. In an alternative embodiment, the data line DL and the corner data line CWLa may be integrally formed as a single unitary body. The corner data line CWLa may overlap at least some of the corner pixels arranged in the corner display area CDA. In one embodiment, for example, the corner data line CWLa may extend along each of the extension portions LP and may overlap the corner pixels arranged at a central portion of each of the extension portions LP. In an embodiment, the corner data line CWLa may be electrically connected to the corner pixels arranged in the corner display area CDA and may be configured to transmit a data signal from the data line DL to the corner pixels.

One end (or an end) of the corner gate line CWLb may be electrically connected to the gate line GL. In an embodiment, the corner gate line CWLb and the gate line GL may be integrally formed as a single unitary body. The corner gate line CWLb may extend along each of the extension portions LP at an edge of each of the extension portions LP. In an embodiment, the corner gate line CWLb may be arranged at one side of each of the corner pixels arranged at the central portion of each of the extension portions LP. In an embodiment, the corner gate line CWLb, which is a corner signal line, may be electrically connected to the corner pixels arranged in the corner display area CDA, and may be configured to transmit a gate signal (e.g., a scan signal and/or an emission control signal) from the gate line GL to the corner pixels.

One end (or an end) of the corner voltage line CWLc may be electrically connected to the voltage line VWL. In an embodiment, the corner voltage line CWLc and the voltage line VWL may be integrally formed as a single unitary body. The corner voltage line CWLc may extend along each of the extension portions LP at the edge of each of the extension portions LP. In an embodiment, the corner voltage line CWLc may be arranged at the other side of each of the corner pixels arranged at the central portion of each of the extension portions LP. Here, the "other side" refers to an opposite side to the side where the aforementioned corner gate line CWLb is arranged. The corner voltage line CWLc may be electrically connected to the corner pixels arranged in the corner display area CDA, and may be configured to transmit the initialization voltage Vint (see FIG. 6B) and/or the common voltage ELVSS (see FIG. 6B) from the voltage line VWL to the corner pixels.

A load portion 400 may be selectively arranged in only some of the extension portions LP. In an embodiment, the extension portions LP may include first extension portions LP1 and second extension portions LP2. In such an embodiment, the first extension portions LP1 refer to extension portions LP where the load portion 400 is not arranged among the extension portions LP, and the second extension portions LP2 refer to extension portions LP where the load portion 400 is arranged among the extension portions LP.

The corner pixels electrically connected to the first corner driving circuit CDRV1 are arranged in the first extension portions LP1 in an extension direction of the first extension portions LP1. One end (or an end) of the corner gate line CWLb arranged in each of the first extension portions LP1 is electrically connected to the first corner driving circuit CDRV1. One end (or an end) of the corner voltage line CWLc arranged in each of the first extension portions LP1 is electrically connected to the voltage line VWL. In an embodiment, the load portion 400 is not arranged in the first extension portions LP1, and thus the corner gate line CWLb and the corner voltage line CWLc arranged in the first extension portions LP1 are not electrically connected to the load portion 400.

The corner pixels electrically connected to the second corner driving circuit CDRV2 are arranged in the second extension portions LP2 along an extension direction of the second extension portions LP2. One end (or an end) of the corner gate line CWLb arranged in each of the second extension portions LP2 is electrically connected to the second corner driving circuit CDRV2, and the other end (or another end or opposing end) of the corner gate line CWLb is electrically connected to the load portion 400. One end (or an end) of the corner voltage line CWLc arranged in each of the second extension portions LP2 is electrically connected to the voltage line VWL, and the other end (or another end or opposing end) of the corner voltage line CWLc is electrically connected to the load portion 400. Accordingly, the load portion 400 arranged in each of the second extension portions LP2 may be electrically connected to the second corner driving circuit CDRV2 through the corner gate line CWLb arranged in each of the second extension portions LP2 and may be electrically connected to the voltage line VWL through the corner voltage line CWLc arranged in each of the second extension portions LP2.

The load portion 400 may stabilize the corner driving circuit CDRV. In an embodiment, unlike the first corner driving circuit CDRV1 that is electrically connected to both of the pixel circuit configured to drive the corner pixels PXc and the pixel circuit configured to drive the front pixels PXf, the load portion 400 may stabilize the second corner driving circuit CDRV2 that is electrically connected to the pixel circuit configured to drive the corner pixels PXc but is not electrically connected to the pixel circuit configured to drive the front pixels PXf. In such an embodiment, because the second corner driving circuit CDRV2 is not electrically connected to the pixel circuit configured to drive the front pixels PXf, an active load of the second corner driving circuit CDRV2 is relatively smaller than that of the first corner driving circuit CDRV1. Accordingly, the second corner driving circuit CDRV2 is relatively greatly influenced by switching that occurs in another element when a signal is changed, that is, when a voltage is applied, so that a ripple may occur, thereby degrading display quality.

In an embodiment of the invention, the display panel includes the load portion 400 that is electrically connected to the second corner driving circuit CDRV2 to provide an additional load, thereby effectively preventing ripples from occurring in the second corner driving circuit CDRV2. In one embodiment, for example, the load portion 400 may be a decoupling capacitor electrically connected to the second corner driving circuit CDRV2. A detailed structure of the load portion 400 will be described below with reference to FIGS. 11 to 13.

In such an embodiment, the load portion 400 may be arranged in an area overlapping the peripheral area PA of the second extension portions LP2. In such an embodiment, because the load portion 400 is arranged in the peripheral area PA, which is a non-display area in which an image is not displayed, an additional dead space may not be generated due to the arrangement of the load portion 400.

Figure 9:
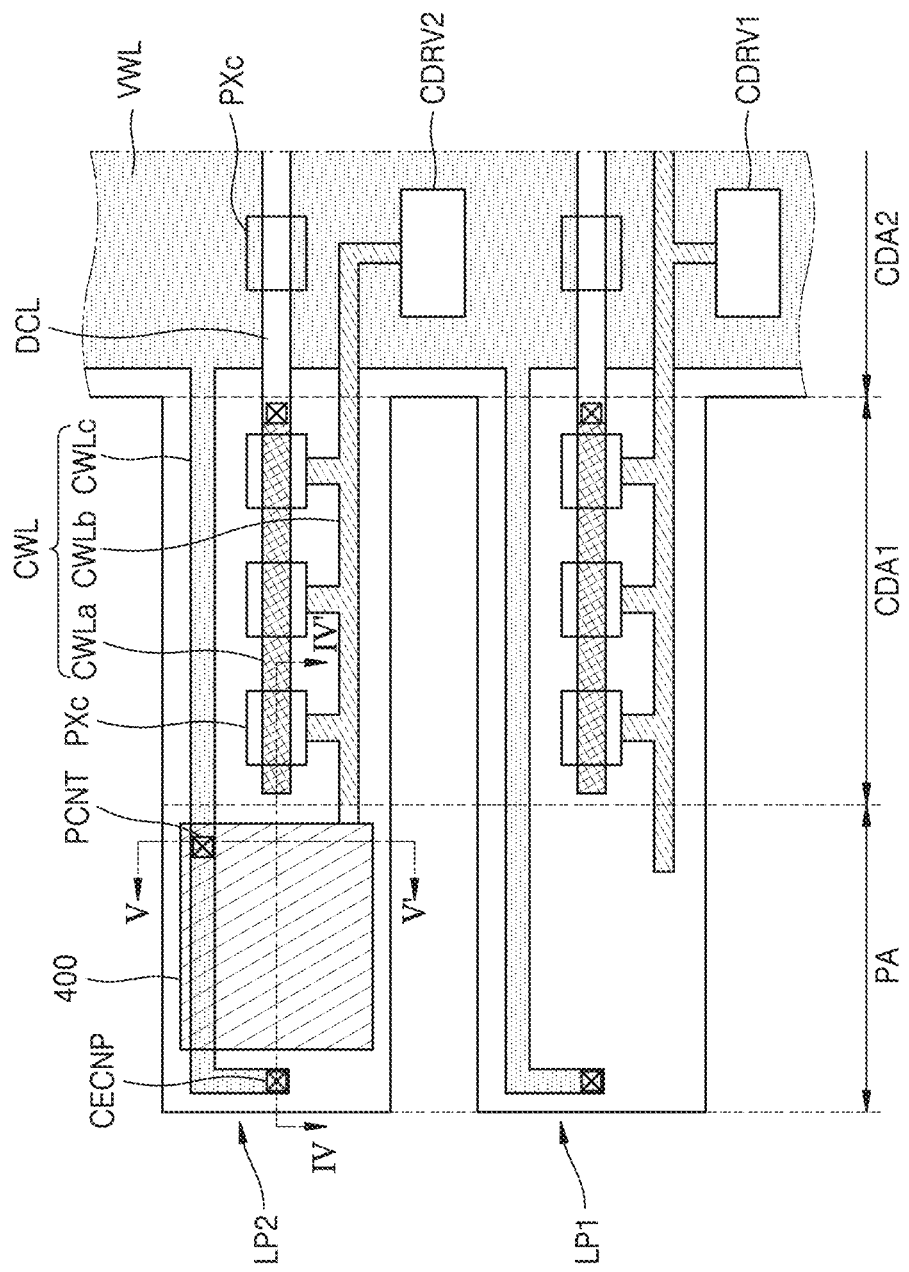
FIG. 9 is a schematic plan view of some of extension portions, according to an embodiment.
Figure 10:
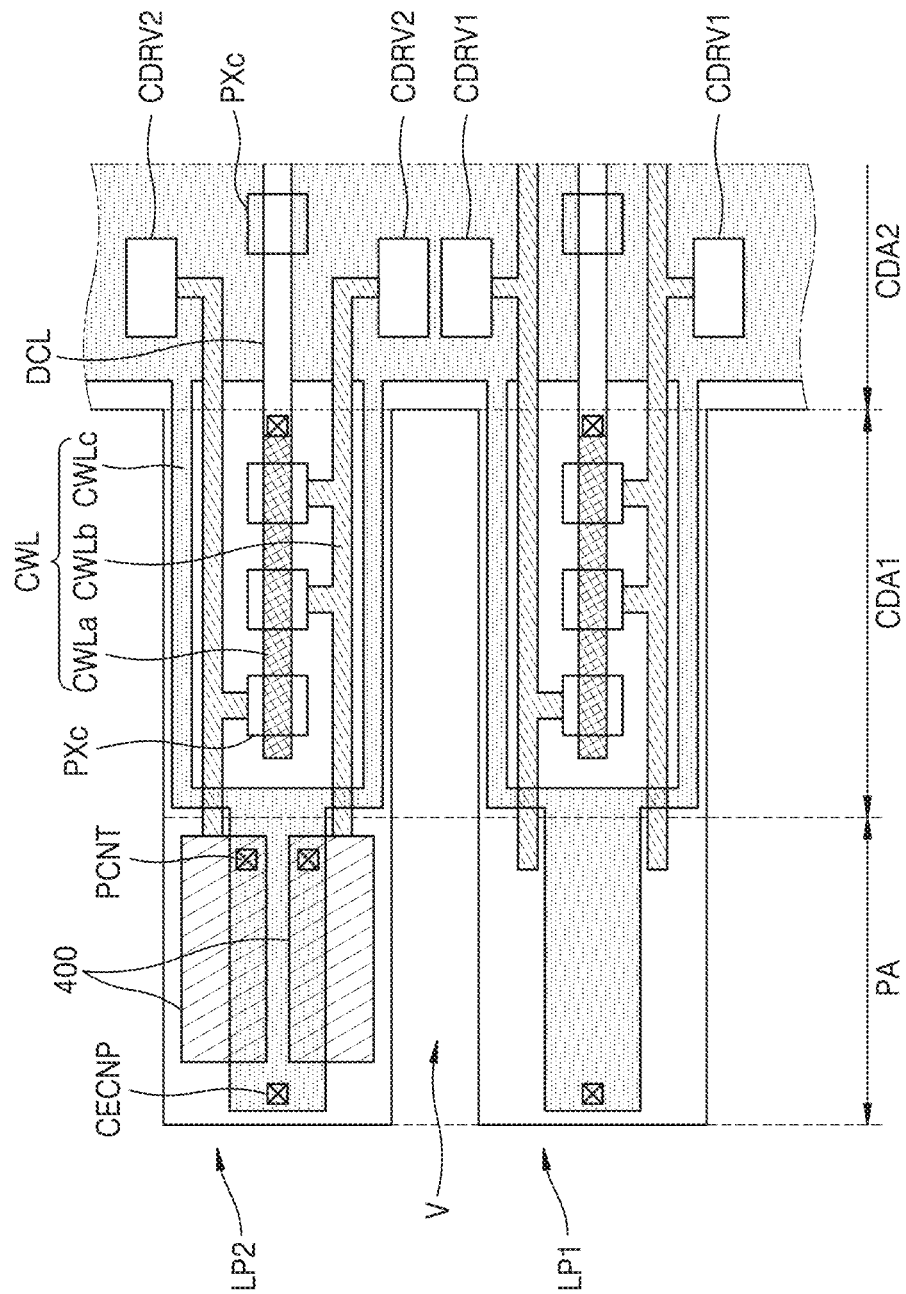
FIG. 10 is a schematic plan view of some of extension portions, according to an alternative embodiment.

FIG. 9 is a schematic plan view of some of extension portions, according to an embodiment, and FIG. 10 is a schematic plan view of some of the extension portions, according to an alternative embodiment. In detail, FIGS. 9 and 10 are enlarged schematic plan views of first and second extension portions LP1 and LP2 which are arranged adjacent to each other. Hereinafter, the same or like reference numerals in the drawings may refer to the same or like elements as those described above, and thus, any repetitive detailed descriptions thereof will be omitted or simplified for conciseness.

In an embodiment, as illustrated in FIG. 9, the corner pixels PXc may be arranged in an extension direction of each of the first and second extension portions LP1 and LP2 at a portion where each of the first and second extension portions LP1 and LP2 overlaps the first corner display area CDA1. In such an embodiment, the corner gate line CWLb is arranged along each of the first and second extension portions LP1 and LP2 on one side of the corner pixels PXc arranged or disposed in each of the first and second extension portions LP1 and LP2, and the corner voltage line CWLc is arranged along each of the first and second extension portions LP1 and LP2 on the other side of the corner pixels PXc.

A connection portion CECNP may be arranged in an area adjacent to an end of each of the first and second extension portions LP1 and LP2. The connection portion CECNP may electrically connect the corner voltage line CWLc to the second electrode 123 (see FIG. 5) of the corner pixels PXc. The connection portion CECNP will be described in greater detail below with reference to FIGS. 11 and 12.

In an embodiment, the load portion 400 may be arranged at an end of an array of the corner pixels PXc arranged in the second extension portion LP2. In such an embodiment, the load portion 400 may not be arranged in the first extension portion LP1.

One end (or an end) of the corner gate line CWLb arranged in the second extension portion LP2 is electrically connected to the second corner driving circuit CDRV2, and the other end (or another end or opposing end) of the corner gate line CWLb is electrically connected to the load portion 400. In an embodiment, the corner gate line CWLb and any one of conductive layers of the load portion 400 may be integrally formed as a single unitary body. One end (or an end) of the corner voltage line CWLc arranged in the second extension portion LP2 is electrically connected to the voltage line VWL, and the other end (or another end or opposing end) of the corner voltage line CWLc is electrically connected to the load portion 400. In an embodiment, the corner voltage line CWLc and the load portion 400 may be electrically connected to each other through a contact hole PCNT defined in an insulating layer therebetween.

The number of load portions 400 arranged in the second extension portion LP2 is not limited and may be variously modified according to a design.

In an embodiment, as illustrated in FIG. 9, the load portion 400 may be arranged by one in each second extension portion LP2. In such an embodiment, a single second corner driving circuit CDRV2 may be arranged to correspond to each second extension portion LP2.

In an alternative embodiment, as illustrated in FIG. 10, two load portions 400 may be arranged in each second extension portion LP2. In such an embodiment, the two second corner driving circuits CDRV2 may be arranged to correspond to each second extension portion LP2, and the corner gate line CWLb and the corner voltage line CWLc may be arranged at one side and the other side of the corner pixels PXc, respectively. One of the two load portions 400 may be electrically connected to each of the second corner driving circuit CDRV2 and the voltage line VWL through the corner gate line CWLb and the corner voltage line CWLc arranged at one side of the corner pixels PXc, and the other of the two load portions 400 may be electrically connected to each of the second corner driving circuit CDRV2 and the voltage line VWL through the corner gate line CWLb and the corner voltage line CWLc arranged at the other side of the corner pixels PXc. In an embodiment, the corner voltage line CWLc arranged at each of one side and the other side of each of the corner pixels PXc may be connected at the end of the array the corner pixels PXc to be integrally formed as a single unitary body, and may overlap, and be electrically connected to, at least part of each of the load portions 400.

In another alternative embodiment, three load portions 400 may be arranged in each second extension portion LP2.

In such embodiments, a shape and area of the load portion 400 arranged in the second extension portion LP2 may also be variously modified to have a desired or predetermined load according to a design.

In an embodiment, when viewed in a direction perpendicular to the substrate 100 (see FIG. 5), that is, when viewed in a plan view, the shape of the load portion 400 may be a polygon, a polygon having at least one side curved, a circle, an ellipse, or a sector shape.

In an embodiment, when viewed in a direction perpendicular to the substrate 100 (see FIG. 5), that is, when viewed in a plan view, a shape of an outer edge of the load portion 400 may correspond to (e.g., be the same as) a shape of an outer edge of the second extension portion LP2 where the load portion 400 is arranged. In one embodiment, for example, when the outer edge of the second extension portion LP2 is a curve having a certain curvature, the outer edge of the load portion 400 may be a curve having the same curvature as the outer edge of the second extension portion LP2.

Figure 11:
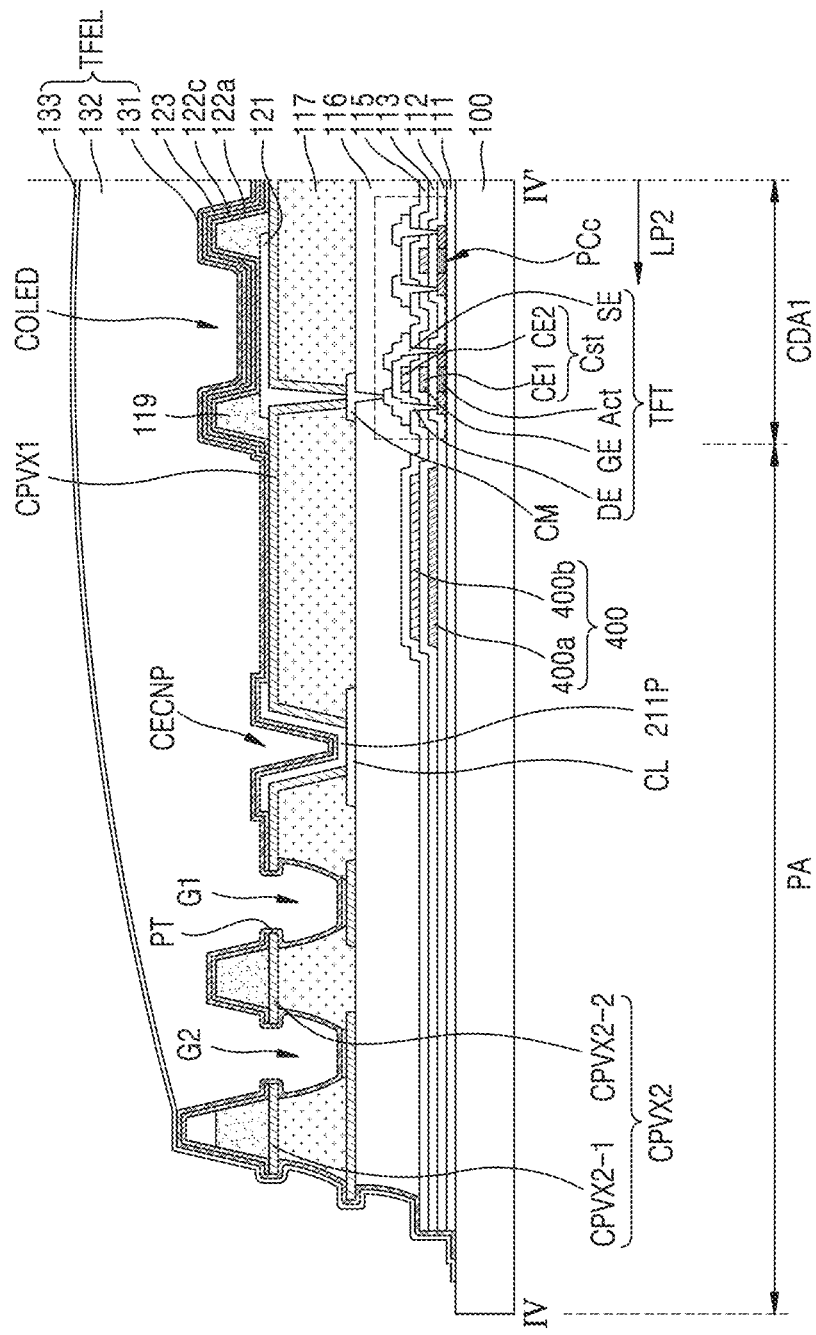
FIG. 11 is a schematic cross-sectional view of a part of an extension portion, according to an embodiment.
Figure 12:
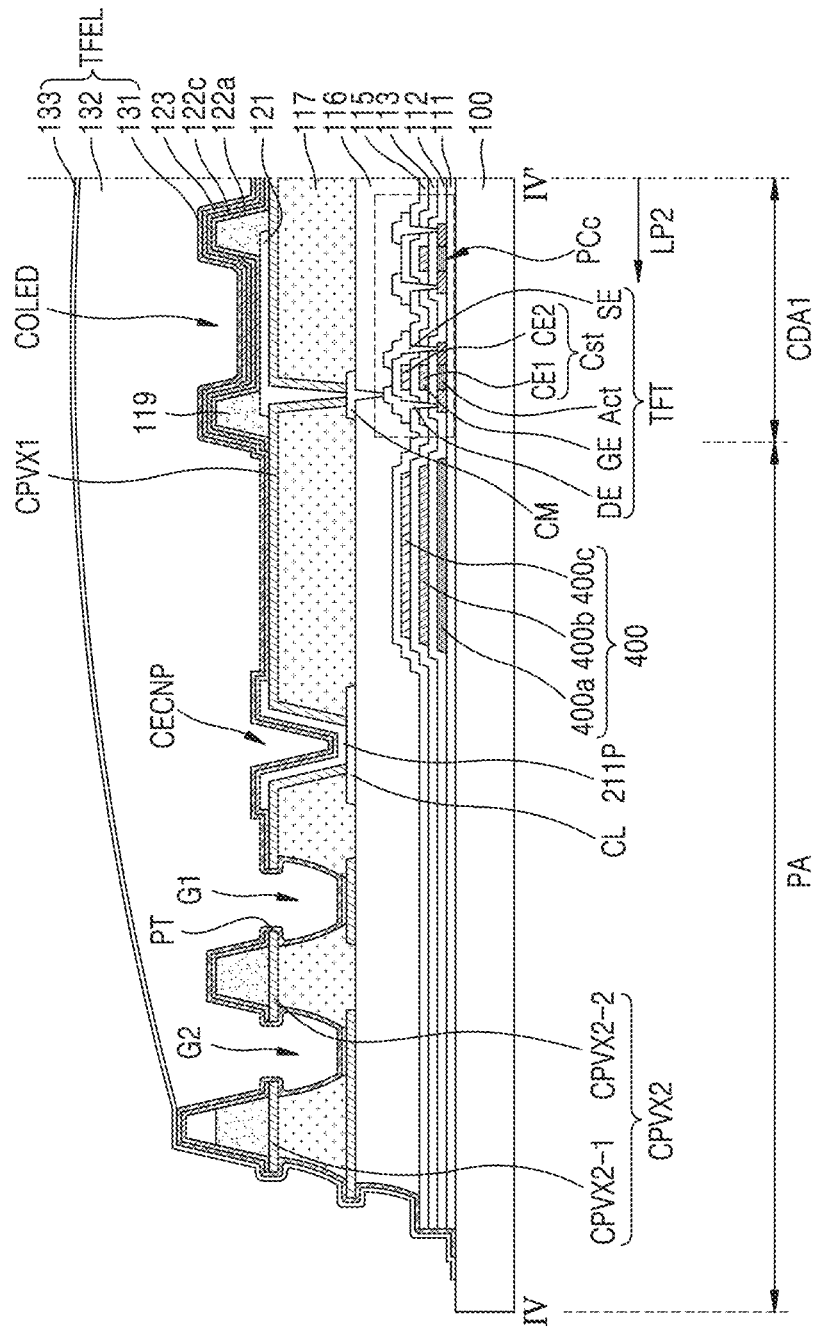
FIG. 12 is a schematic cross-sectional view of a part of an extension portion, according to an alternative embodiment.
Figure 13:
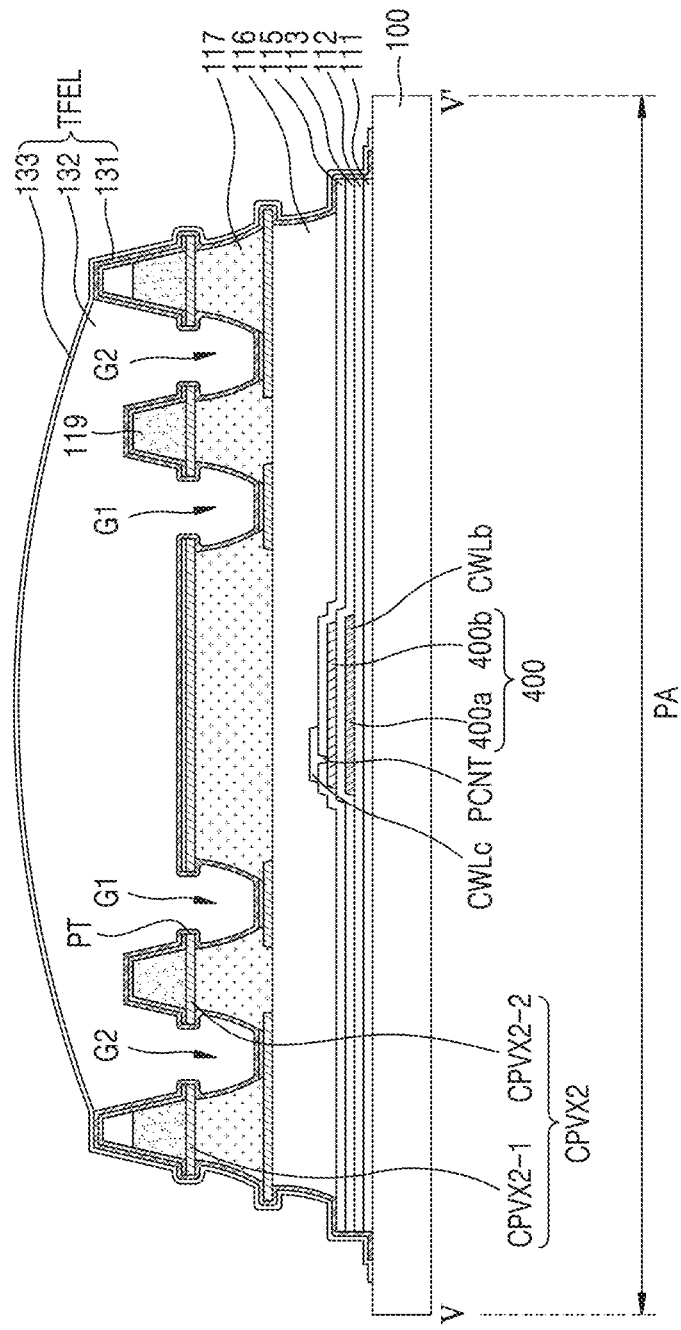
FIG. 13 is a schematic cross-sectional view of a part of a load portion, according to an embodiment.

FIG. 11 is a schematic cross-sectional view of a part of an extension portion, according to an embodiment, FIG. 12 is a schematic cross-sectional view of a part of the extension portion, according to an alternative embodiment, and FIG. 13 is a schematic cross-sectional view of a part of a load portion, according to an embodiment.

In detail, FIGS. 11 and 12 correspond to cross-sectional views of the display panel taken along line IV-IV' of FIG. 9, and FIG. 13 corresponds to a cross-sectional view of the display panel taken along line V-V of FIG. 9. Hereinafter, the same or like reference numerals in the drawings may refer to the same or like elements as those described above, and thus, any repetitive detailed descriptions thereof will be omitted or simplified for conciseness.

Referring to FIGS. 11 and 12, an embodiment of the display panel includes the substrate 100 including the first corner display area CDA1 arranged at a corner of the display panel and the peripheral area PA arranged outside the first corner display area CDA1.

In an embodiment, the corner pixel circuit PCc and a corner organic light-emitting diode COLED that is arranged or disposed on the corner pixel circuit PCc and electrically connected to the corner pixel circuit PCc may be positioned in the first corner display area CDA1.

A first groove G1 and a second groove G2, the connection portion CECNP, and the load portion 400 may be positioned in the peripheral area PA. FIGS. 11 and 12 illustrates an embodiment where the connection portion CECNP is arranged further outside than the load portion 400, but one or more embodiments are not limited thereto.

A first corner inorganic pattern layer CPVX1 may be between the second organic insulating layer 117 and the corner organic light-emitting diode COLED. A second corner inorganic pattern layer CPVX2 may be apart from the first corner inorganic pattern layer CPVX1 on the second organic insulating layer 117 with the first groove G1 therebetween. The second corner inorganic pattern layer CPVX2 may include an outer inorganic pattern layer CPVX2-1 and an inner inorganic pattern layer CPVX2-2, which are apart from each other. Each of the first corner inorganic pattern layer CPVX1 and the second corner inorganic pattern layer CPVX2 may have a protruding tip PT protruding toward a center of each of the first groove G1 and the second groove G2. The protruding tips PT may be formed before the intermediate layer 122 and the second electrode 123 are formed, and the intermediate layer 122 and/or the second electrode 123 may be disconnected by the protruding tips PT.

The connection portion CECNP may include a pattern electrode 211P and a connection line CL. The pattern electrode 211P on the second organic insulating layer 117 may contact the connection line CL on the first organic insulating layer 116 through an opening defined in the second organic insulating layer 117. In an embodiment, the connection line CL may be electrically connected to the voltage line VWL (see FIG. 9). The initialization voltage Vint (see FIG. 6B) and/or the common voltage ELVSS (see FIG. 6B) may be applied from the voltage line VWL to the second electrode 123 through the connection portion CECNP.

The load portion 400 may be positioned in the peripheral area PA and may be arranged further outside than the corner pixel circuit PCc. The load portion 400 may include a plurality of conductive layers overlapping each other. The conductive layers overlapping each other function as a capacitor to have a preset electric capacitance. The load portion 400 may provide a decoupling effect to the second corner driving circuit CDRV2 (see FIG. 9) through the electric capacitance. In such an embodiment, the electric capacitance of the load portion 400 may be variously modified to provide a desired or predetermined load according to a design.

The number, layer structure, and material of the conductive layers included in the load portion 400 are not limited and may be variously modified to have a desired or predetermined load according to a design. In an embodiment, the other end of the aforementioned corner gate line CWLb (see FIG. 9) may be electrically connected to the lowermost layer among the conductive layers included in the load portion 400, and the other end of the corner voltage line CWLc (see FIG. 9) may be electrically connected to the uppermost layer among the conductive layers included in the load portion 400.

In an embodiment, as illustrated in FIG. 11, the load portion 400 may include a first conductive layer 400a and a second conductive layer 400b that is positioned on the first conductive layer 400a and overlaps the first conductive layer 400a. In such an embodiment, the other end of the corner gate line CWLb may be electrically connected to the first conductive layer 400a, and the other end of the corner voltage line CWLc may be electrically connected to the second conductive layer 400b.

The first conductive layer 400a and a gate electrode GE of any one of thin-film transistors TFT of the corner pixel circuit PCc and/or the lower electrode CE1 of the storage capacitor Cst may have a same layer structure as each other and include a same material as each other. In an embodiment, the first conductive layer 400a may be positioned on the first gate insulating layer 112. The first conductive layer 400a may include at least one selected from various conductive materials including Mo, Al, Cu, Ti, and the like and may have one of various layer structures. In one embodiment, for example, the first conductive layer 400a may include a Mo layer and an Al layer or may have a multi-layered structure of a Mo layer/an Al layer/a Mo layer.

The second conductive layer 400b and an upper electrode CE2 of any one of storage capacitors Cst of the corner pixel circuit PCc may have a same layer structure as each other and include a same material as each other. In an embodiment, the second conductive layer 400b may be positioned on the second gate insulating layer 113. The second conductive layer 400b may include Al, Pt, Pd, Ag, Mg, Au, Ni, Nd, Ir, Cr, Ca, Mo, Ti, W, and/or Cu and may have a single layer structure or a multilayer structure, each layer including at least one selected from the aforementioned material.

In an alternative embodiment, when the load portion 400 includes the first conductive layer 400a and the second conductive layer 400b, unlike FIG. 11, the first conductive layer 400a and any one of the semiconductor layer Act, the gate electrode GE, the lower electrode CE1, and the upper electrode CE2 may have the same layer structure and include the same material, and the second conductive layer 400b and any one of the gate electrode GE, the lower electrode CE1, the upper electrode CE2, the source electrode SE, and the drain electrode DE may have a same layer structure as each other and include a same material as each other.

In another alternative embodiment, as illustrated in FIG. 12, the load portion 400 may include the first conductive layer 400a, the second conductive layer 400b that is arranged or disposed on the first conductive layer 400a and overlaps the first conductive layer 400a, and a third conductive layer 400c that is arranged or disposed on the second conductive layer 400b and overlaps the second conductive layer 400b. In such an embodiment, the other end of the corner gate line CWLb may be electrically connected to the first conductive layer 400a, and the other end of the corner voltage line CWLc may be electrically connected to the third conductive layer 400c.

The first conductive layer 400a and a semiconductor layer Act of any one of the thin-film transistors TFT of the corner pixel circuit PCc may have a same layer structure as each other and include a same material as each other. In an embodiment, the first conductive layer 400a may be positioned on the buffer layer 111. In an embodiment, the first conductive layer 400a may include polysilicon or amorphous silicon. In an alternative embodiment, the first conductive layer 400a may include an oxide of at least one selected from In, Ga, Sn, Zr, V, Hf, Cd, Ge, Cr, Ti, and Zn.

The second conductive layer 400b and a gate electrode GE of any one of the thin-film transistors TFT of the corner pixel circuit PCc and/or the lower electrode CE1 of the storage capacitor Cst may have a same layer structure as each other and include a same material as each other. In an embodiment, the second conductive layer 400b may be positioned on the first gate insulating layer 112. In an embodiment, the second conductive layer 400b may include at least one selected from various conductive materials including Mo, Al, Cu, Ti, and the like and may have one of various layer structures. In one embodiment, for example, the second conductive layer 400b may include a Mo layer and an Al layer or may have a multi-layered structure of a Mo layer/an Al layer/a Mo layer.

The third conductive layer 400c and an upper electrode CE2 of any one of the storage capacitors Cst of the corner pixel circuit PCc may have a same layer structure as each other and include a same material as each other. In an embodiment, the third conductive layer 400c may be positioned on the second gate insulating layer 113. The third conductive layer 400c may include Al, Pt, Pd, Ag, Mg, Au, Ni, Nd, Ir, Cr, Ca, Mo, Ti, W, and/or Cu and may have a single layer structure or a multilayer structure, each layer including at least one selected from the aforementioned material.

In another alternative embodiment, where the load portion 400 includes the first conductive layer 400a, the second conductive layer 400b, and the third conductive layer 400c, unlike FIG. 12, the first conductive layer 400a and any one of the semiconductor layer Act, the gate electrode GE, and the lower electrode CE1 may have a same layer structure as each other and include a same material as each other, the second conductive layer 400b and any one of the gate electrode GE, the lower electrode CE1, and the upper electrode CE2 may have a same layer structure as each other and include a same material as each other, and the third conductive layer 400c and any one of the upper electrode CE2, the source electrode SE, and the drain electrode DE may have a same layer structure as each other and include a same material as each other.

In an embodiment, the uppermost layer of the conductive layers included in the load portion 400 may be electrically connected to the corner voltage line CWLc through the contact hole PCNT. In an embodiment, as show in FIG. 13, where the load portion 400 includes the first conductive layer 400a and the second conductive layer 400b, the second conductive layer 400b, which is the uppermost layer, is electrically connected to the corner voltage line CWLc. In such an embodiment, the second conductive layer 400b and the corner voltage line CWLc may be electrically connected through the contact hole PCNT defined in the interlayer insulating layer 115. In such embodiments described above, the uppermost layer of the conductive layers included in the load portion 400 may be electrically connected to the corner voltage line CWLc through the contact hole PCNT defined in the insulating layer(s) therebetween.

Herein, embodiments of the display panel and the display apparatus have been described in detail, but the invention should not be construed as being limited to the embodiments set forth herein. Rather, these embodiments are provided so that this disclosure will be thorough and complete and will fully convey the concept of the invention to those skilled in the art. For example, methods of manufacturing the display panel and the display apparatus will also fall within the scope of the disclosure.

According to embodiments as described above, a display panel, in which a display area is expended to display an image even on side areas and/or corner areas, and a display apparatus including the display panel may be implemented. However, the scope of the disclosure is not limited to these effects.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display panel comprising:
   a substrate including a front display area, a corner display area extending from a corner of the front display area, and a peripheral area outside the corner display area, wherein the corner display area includes a first corner display area and a second corner display area, the first corner display area includes extension portions extending in a direction away from the front display area, and cutout portions are defined in the first corner display area between the extension portions;
   a first corner driving circuit positioned in the second corner display area and electrically connected to each of a front pixel arranged in the front display area and a corner pixel arranged in the first corner display area;
   a second corner driving circuit positioned in the second corner display area, electrically connected to another corner pixel arranged in the first corner display area, and not electrically connected to any front pixel; and
   a load portion positioned in the peripheral area and electrically connected to the second corner driving circuit.

2. The display panel of claim 1, wherein
   the extension portions include a first extension portion in which the load portion is not positioned and a second extension portion in which the load portion is positioned,
   the corner pixel electrically connected to the first corner driving circuit is arranged in the first extension portion along an extending direction of the first extension portion, and,
   the another corner pixel electrically connected to the second corner driving circuit is arranged in the second extension portion along an extending direction of the second extension portion.

3. The display panel of claim 2, further comprising:
a voltage line positioned in the second corner display area;
a corner voltage line extending in the extending direction of the second extension portion in the second extension portion, and including an end electrically connected to the voltage line and another end electrically connected to the load portion; and
a corner signal line extending in the extending direction of the second extension portion in the second extension portion, and including an end electrically connected to the second corner driving circuit and another end electrically connected to the load portion.

4. The display panel of claim 3, wherein
the load portion includes a first conductive layer and a second conductive layer, wherein the second conductive layer is disposed on the first conductive layer and overlapping the first conductive layer,
the another end of the corner signal line is electrically connected to the first conductive layer, and
the another end of the corner voltage line is electrically connected to the second conductive layer.

5. The display panel of claim 4, wherein
the corner pixel is electrically connected to a corner pixel circuit including at least one thin-film transistor and at least one storage capacitor,
the at least one thin-film transistor includes a semiconductor layer, a gate electrode overlapping the semiconductor layer, and a source electrode and a drain electrode which are electrically connected to the semiconductor layer,
the at least one storage capacitor includes a lower electrode and an upper electrode, wherein the lower electrode is disposed in a same layer as the gate electrode, and the upper electrode overlaps the lower electrode,
the first conductive layer and at least one selected from the gate electrode and the lower electrode have a same layer structure as each other and include a same material as each other, and
the second conductive layer and the upper electrode have a same layer structure as each other and include a same material as each other.

6. The display panel of claim 3, wherein
the load portion includes a first conductive layer, a second conductive layer disposed on the first conductive layer and overlapping the first conductive layer, and a third conductive layer disposed on the second conductive layer and overlapping the second conductive layer,
the another end of the corner signal line is electrically connected to the first conductive layer, and
the another end of the corner voltage line is electrically connected to the third conductive layer.

7. The display panel of claim 6, wherein
the corner pixel is electrically connected to a corner pixel circuit including at least one thin-film transistor and at least one storage capacitor,
the at least one thin-film transistor includes a semiconductor layer, a gate electrode overlapping the semiconductor layer, and a source electrode and a drain electrode which are electrically connected to the semiconductor layer,
the at least one storage capacitor includes a lower electrode and an upper electrode, wherein the lower electrode is disposed in a same layer as the gate electrode, and the upper electrode overlaps the lower electrode,
the first conductive layer and the semiconductor layer have a same layer structure as each other and include a same material as each other,
the second conductive layer and at least one selected from the gate electrode and the lower electrode have a same layer structure as each other and include a same material as each other, and
the third conductive layer and the upper electrode have a same layer structure as each other and include a same material as each other.

8. The display panel of claim 2, wherein, when viewed in a direction perpendicular to an upper surface of the substrate, a shape of an outer edge of the load portion correspond to a shape of an outer edge of an extension portion in which the load portion is positioned, among the extension portions.

9. The display panel of claim 2, wherein one load portion is positioned in each second extension portion.

10. The display panel of claim 2, wherein two load portions are arranged in each second extension portion.

11. The display panel of claim 1, wherein the another corner pixel arranged in the second corner display area overlaps the first corner driving circuit or the second corner driving circuit.

12. The display panel of claim 1, wherein
the display area further includes a side display area extending from a side surface of the front display area, and
a side pixel is arranged in the side display area.

13. A display apparatus comprising:
a display panel including a front display area, a corner display area extending from a corner of the front display area and bent at a preset radius of curvature, and a peripheral area outside the corner display area, wherein the corner display area includes a first corner display area and a second corner display area; and
a cover window covering the display panel and having a shape corresponding to a shape of the display panel,
wherein the display panel includes:
a first corner driving circuit positioned in the second corner display area and electrically connected to each of a front pixel arranged in the front display area and a corner pixel arranged in the first corner display area;
a second corner driving circuit positioned in the second corner display area, electrically connected to another corner pixel arranged in the first corner display area, and not electrically connected to any front pixel; and
a load portion positioned in the peripheral area and electrically connected to the second corner driving circuit.

14. The display apparatus of claim 13, wherein
the first corner display area includes extension portions extending in a direction away from the front display area,
the extension portions include a first extension portion in which the load portion is not positioned and a second extension portion in which the load portion is positioned,
the corner pixel electrically connected to the first corner driving circuit is arranged in the first extension portion along an extending direction of the first extension portion, and,
the another corner pixel electrically connected to the second corner driving circuit is arranged in the second extension portion along an extending direction of the second extension portion.

15. The display apparatus of claim 14, further comprising:
a voltage line positioned in the second corner display area;
a corner voltage line extending in the extending direction of the second extension portion in the second extension portion, and including an end electrically connected to the voltage line and another end electrically connected to the load portion; and
a corner signal line extending in the extending direction of the second extension portion in the second extension portion, and including an end electrically connected to the second corner driving circuit and another end electrically connected to the load portion.

16. The display apparatus of claim 15, wherein
the load portion includes a first conductive layer and a second conductive layer, wherein the second conductive layer is disposed on the first conductive layer and overlapping the first conductive layer,
the another end of the corner signal line is electrically connected to the first conductive layer, and
the another end of the corner voltage line is electrically connected to the second conductive layer.

17. The display apparatus of claim 16, wherein
the corner pixel is electrically connected to a corner pixel circuit including at least one thin-film transistor and at least one storage capacitor,
the at least one thin-film transistor includes a semiconductor layer, a gate electrode overlapping the semiconductor layer, and a source electrode and a drain electrode which are electrically connected to the semiconductor layer,
the at least one storage capacitor includes a lower electrode and an upper electrode, wherein the lower electrode is disposed in a same layer as the gate electrode, and the upper electrode overlaps the lower electrode,
the first conductive layer and at least one selected from the gate electrode and the lower electrode have a same layer structure as each other and include a same material as each other, and
the second conductive layer and the upper electrode have a same layer structure as each other and include a same material as each other.

18. The display apparatus of claim 15, wherein
the load portion includes a first conductive layer, a second conductive layer disposed on the first conductive layer and overlapping the first conductive layer, and a third conductive layer disposed on the second conductive layer and overlapping the second conductive layer,
the another end of the corner signal line is electrically connected to the first conductive layer, and
the another end of the corner voltage line is electrically connected to the third conductive layer.

19. The display apparatus of claim 18, wherein
the corner pixel is electrically connected to a corner pixel circuit including at least one thin-film transistor and at least one storage capacitor,
the at least one thin-film transistor includes a semiconductor layer, a gate electrode overlapping the semiconductor layer, and a source electrode and a drain electrode which are electrically connected to the semiconductor layer,
the at least one storage capacitor includes a lower electrode and an upper electrode, wherein the lower electrode is disposed in a same layer as the gate electrode, and the upper electrode overlaps the lower electrode,
the first conductive layer and the semiconductor layer have a same layer structure as each other and include a same material as each other,
the second conductive layer and at least one selected from the gate electrode and the lower electrode have a same layer structure as each other and include a same material as each other, and
the third conductive layer and the upper electrode have a same layer structure as each other and include a same material as each other.

20. The display apparatus of claim 14, wherein, on a plan view, a shape of an outer edge of the load portion corresponds to a shape of an outer edge of an extension portion in which the load portion is positioned, among the extension portions.

* * * * *